United States Patent
Suzuki

(10) Patent No.: US 12,125,514 B2
(45) Date of Patent: Oct. 22, 2024

(54) APPARATUSES AND METHODS FOR ACCESS BASED REFRESH OPERATIONS

(71) Applicant: MICRON TECHNOLOGY, INC., Boise, ID (US)

(72) Inventor: Takamasa Suzuki, Tokyo (JP)

(73) Assignee: Micron Technology, Inc., Boise, ID (US)

(*) Notice: Subject to any disclaimer, the term of this patent is extended or adjusted under 35 U.S.C. 154(b) by 47 days.

(21) Appl. No.: 17/731,529

(22) Filed: Apr. 28, 2022

(65) Prior Publication Data

US 2023/0352075 A1    Nov. 2, 2023

(51) Int. Cl.
| | |
|---|---|
| G11C 7/00 | (2006.01) |
| G11C 11/406 | (2006.01) |
| G11C 11/408 | (2006.01) |
| G11C 11/4093 | (2006.01) |

(52) U.S. Cl.
CPC ... *G11C 11/40611* (2013.01); *G11C 11/40618* (2013.01); *G11C 11/4085* (2013.01); *G11C 11/4093* (2013.01)

(58) Field of Classification Search
CPC ......... G11C 11/40611; G11C 11/40618; G11C 11/4085; G11C 11/4093; G11C 11/40603
USPC ...................................................... 365/222
See application file for complete search history.

(56) References Cited

U.S. PATENT DOCUMENTS

| | | |
|---|---|---|
| 5,225,839 A | 7/1993 | Okurowski et al. |
| 5,299,159 A | 3/1994 | Balistreri et al. |
| 5,654,929 A | 8/1997 | Mote, Jr. |
| 5,699,297 A | 12/1997 | Yamazaki et al. |
| 5,867,442 A | 2/1999 | Kim et al. |
| 5,933,377 A | 8/1999 | Hidaka |
| 5,943,283 A | 8/1999 | Wong et al. |
| 5,956,288 A | 9/1999 | Beringham et al. |
| 5,959,923 A | 9/1999 | Matteson et al. |
| 5,970,507 A | 10/1999 | Kato et al. |
| 5,999,471 A | 12/1999 | Choi |
| 5,999,473 A | 12/1999 | Harrington et al. |

(Continued)

FOREIGN PATENT DOCUMENTS

| | | |
|---|---|---|
| BE | 825677 A | 8/1975 |
| CN | 1841551 A | 10/2006 |

(Continued)

OTHER PUBLICATIONS

U.S. Appl. No. 18/064,773, filed Dec. 12, 2022, titled, "Apparatuses and Methods for Access Based Refresh Timing," pp. all pages of application as filed.

(Continued)

*Primary Examiner* — Hoai V Ho
*Assistant Examiner* — Minh Dinh
(74) *Attorney, Agent, or Firm* — Dorsey & Whitney LLP

(57) ABSTRACT

Apparatuses, systems, and methods for access based refresh operations. A memory bank may be divided into multiple sub-banks, each of which has a refresh control circuit. A word line in a first sub-bank may be refreshed responsive to a word line in a second sub-bank being accessed. Once a threshold number of refreshes have been performed in the sub-bank, further accesses to the other sub-banks may be ignored. If the threshold has not been met at the end of a refresh period, then the refresh control circuit may issue a refresh signal.

20 Claims, 7 Drawing Sheets

(56) References Cited

U.S. PATENT DOCUMENTS

| | | |
|---|---|---|
| 6,002,629 A | 12/1999 | Kim et al. |
| 6,011,734 A | 1/2000 | Pappert |
| 6,061,290 A | 5/2000 | Shirley |
| 6,064,621 A | 5/2000 | Tanizaki et al. |
| 6,212,118 B1 | 4/2001 | Fujita |
| 6,306,721 B1 | 10/2001 | Teo et al. |
| 6,310,806 B1 | 10/2001 | Higashi et al. |
| 6,310,814 B1 | 10/2001 | Hampel et al. |
| 6,363,024 B1 | 3/2002 | Fibranz |
| 6,392,952 B1 | 5/2002 | Chen et al. |
| 6,424,582 B1 | 7/2002 | Ooishi |
| 6,434,064 B2 | 8/2002 | Nagai |
| 6,452,868 B1 | 9/2002 | Fister |
| 6,490,216 B1 | 12/2002 | Chen et al. |
| 6,515,928 B2 | 2/2003 | Sato et al. |
| 6,535,950 B1 | 3/2003 | Funyu et al. |
| 6,535,980 B1 | 3/2003 | Kumar et al. |
| 6,563,757 B2 * | 5/2003 | Agata .................. G11C 11/406 365/230.06 |
| 6,567,340 B1 | 5/2003 | Nataraj et al. |
| 6,950,364 B2 | 9/2005 | Kim |
| 7,002,868 B2 | 2/2006 | Takahashi |
| 7,057,960 B1 | 6/2006 | Fiscus et al. |
| 7,082,070 B2 | 7/2006 | Hong |
| 7,187,607 B2 | 3/2007 | Koshikawa et al. |
| 7,203,113 B2 | 4/2007 | Takahashi et al. |
| 7,203,115 B2 | 4/2007 | Eto et al. |
| 7,209,402 B2 | 4/2007 | Shinozaki et al. |
| 7,215,588 B2 | 5/2007 | Lee |
| 7,444,577 B2 | 10/2008 | Best et al. |
| 7,551,502 B2 | 6/2009 | Dono et al. |
| 7,565,479 B2 | 7/2009 | Best et al. |
| 7,692,993 B2 | 4/2010 | Iida et al. |
| 7,830,742 B2 | 11/2010 | Han |
| 8,174,921 B2 | 5/2012 | Kim et al. |
| 8,400,805 B2 | 3/2013 | Yoko |
| 8,526,260 B2 | 9/2013 | Pyeon |
| 8,572,423 B1 | 10/2013 | Isachar et al. |
| 8,625,360 B2 | 1/2014 | Iwamoto et al. |
| 8,681,578 B2 | 3/2014 | Narui |
| 8,756,368 B2 | 6/2014 | Best et al. |
| 8,811,100 B2 | 8/2014 | Ku |
| 8,862,973 B2 | 10/2014 | Zimmerman et al. |
| 8,938,573 B2 | 1/2015 | Greenfield et al. |
| 9,032,141 B2 | 5/2015 | Bains et al. |
| 9,047,978 B2 | 6/2015 | Bell et al. |
| 9,076,499 B2 | 7/2015 | Schoenborn et al. |
| 9,076,548 B1 | 7/2015 | Park et al. |
| 9,087,602 B2 | 7/2015 | Youn et al. |
| 9,117,544 B2 | 8/2015 | Bains et al. |
| 9,123,447 B2 | 9/2015 | Lee et al. |
| 9,153,294 B2 | 10/2015 | Kang |
| 9,190,137 B2 | 11/2015 | Kim et al. |
| 9,190,139 B2 | 11/2015 | Jung et al. |
| 9,236,110 B2 | 1/2016 | Bains et al. |
| 9,251,885 B2 | 2/2016 | Greenfield et al. |
| 9,286,964 B2 | 3/2016 | Halbert et al. |
| 9,299,400 B2 | 3/2016 | Bains et al. |
| 9,311,984 B1 | 4/2016 | Hong et al. |
| 9,311,985 B2 | 4/2016 | Lee et al. |
| 9,324,398 B2 | 4/2016 | Jones et al. |
| 9,384,821 B2 | 7/2016 | Bains et al. |
| 9,390,782 B2 | 7/2016 | Best et al. |
| 9,396,786 B2 | 7/2016 | Yoon et al. |
| 9,406,358 B1 | 8/2016 | Lee |
| 9,412,432 B2 | 8/2016 | Narui et al. |
| 9,418,723 B2 | 8/2016 | Chishti et al. |
| 9,424,907 B2 | 8/2016 | Fujishiro |
| 9,484,079 B2 | 11/2016 | Lee |
| 9,514,850 B2 | 12/2016 | Kim |
| 9,570,143 B2 | 2/2017 | Lim et al. |
| 9,570,201 B2 | 2/2017 | Morgan et al. |
| 9,646,672 B1 | 5/2017 | Kim et al. |
| 9,653,139 B1 | 5/2017 | Park |
| 9,672,889 B2 | 6/2017 | Lee et al. |
| 9,685,240 B1 | 6/2017 | Park |
| 9,691,466 B1 | 6/2017 | Kim |
| 9,697,913 B1 | 7/2017 | Mariani et al. |
| 9,734,887 B1 | 8/2017 | Tavva |
| 9,741,409 B2 | 8/2017 | Jones et al. |
| 9,741,421 B1 | 8/2017 | Hedden |
| 9,741,447 B2 | 8/2017 | Akamatsu |
| 9,747,971 B2 | 8/2017 | Bains et al. |
| 9,761,297 B1 | 9/2017 | Tomishima |
| 9,786,351 B2 | 10/2017 | Lee et al. |
| 9,799,391 B1 | 10/2017 | Wei |
| 9,805,782 B1 | 10/2017 | Liou |
| 9,805,783 B2 | 10/2017 | Ito et al. |
| 9,812,185 B2 | 11/2017 | Fisch et al. |
| 9,818,469 B1 | 11/2017 | Kim et al. |
| 9,831,003 B2 | 11/2017 | Sohn et al. |
| 9,865,326 B2 | 1/2018 | Bains et al. |
| 9,865,328 B1 | 1/2018 | Desimone et al. |
| 9,892,779 B2 | 2/2018 | Kang et al. |
| 9,922,694 B2 | 3/2018 | Akamatsu |
| 9,934,143 B2 | 4/2018 | Bains et al. |
| 9,953,696 B2 | 4/2018 | Kim |
| 9,972,377 B2 | 5/2018 | Oh et al. |
| 9,978,430 B2 | 5/2018 | Seo et al. |
| 10,020,045 B2 | 7/2018 | Riho |
| 10,020,046 B1 | 7/2018 | Uemura |
| 10,032,501 B2 | 7/2018 | Ito et al. |
| 10,049,716 B2 | 8/2018 | Proebsting |
| 10,083,737 B2 | 9/2018 | Bains et al. |
| 10,090,038 B2 | 10/2018 | Shin |
| 10,134,461 B2 | 11/2018 | Bell et al. |
| 10,141,042 B1 | 11/2018 | Richter |
| 10,147,472 B2 | 12/2018 | Jones et al. |
| 10,153,031 B2 | 12/2018 | Akamatsu |
| 10,170,174 B1 | 1/2019 | Ito et al. |
| 10,192,608 B2 | 1/2019 | Morgan |
| 10,210,925 B2 | 2/2019 | Bains et al. |
| 10,297,305 B1 | 5/2019 | Moon et al. |
| 10,297,307 B1 | 5/2019 | Raad et al. |
| 10,339,994 B2 | 7/2019 | Ito et al. |
| 10,381,327 B2 | 8/2019 | Ramachandra et al. |
| 10,446,256 B2 | 10/2019 | Ong et al. |
| 10,468,076 B1 | 11/2019 | He et al. |
| 10,490,250 B1 | 11/2019 | Ito et al. |
| 10,490,251 B2 | 11/2019 | Wolff |
| 10,504,577 B1 | 12/2019 | Alzheimer |
| 10,510,396 B1 | 12/2019 | Notani et al. |
| 10,572,377 B1 | 2/2020 | Zhang et al. |
| 10,573,370 B2 | 2/2020 | Ito et al. |
| 10,607,679 B2 | 3/2020 | Nakaoka |
| 10,685,696 B2 | 6/2020 | Brown et al. |
| 10,699,796 B2 | 6/2020 | Benedict et al. |
| 10,790,005 B1 | 9/2020 | He et al. |
| 10,825,505 B2 | 11/2020 | Rehmeyer |
| 10,832,792 B1 | 11/2020 | Penney et al. |
| 10,930,335 B2 | 2/2021 | Bell et al. |
| 10,943,636 B1 | 3/2021 | Wu et al. |
| 10,950,289 B2 | 3/2021 | Ito et al. |
| 10,957,377 B2 | 3/2021 | Noguchi |
| 10,964,378 B2 | 3/2021 | Ayyapureddi et al. |
| 10,978,132 B2 | 4/2021 | Rehmeyer et al. |
| 11,017,833 B2 | 5/2021 | Wu et al. |
| 11,069,393 B2 | 7/2021 | Cowles et al. |
| 11,081,160 B2 | 8/2021 | Ito et al. |
| 11,222,683 B2 | 1/2022 | Rehmeyer |
| 11,222,686 B1 | 1/2022 | Noguchi |
| 11,227,649 B2 | 1/2022 | Meier et al. |
| 11,264,079 B1 | 3/2022 | Roberts |
| 11,302,374 B2 | 4/2022 | Jenkinson et al. |
| 11,302,377 B2 | 4/2022 | Li et al. |
| 11,309,010 B2 | 4/2022 | Ayyapureddi |
| 11,309,012 B2 | 4/2022 | Meier et al. |
| 11,315,619 B2 | 4/2022 | Wolff |
| 11,315,620 B2 | 4/2022 | Ishikawa et al. |
| 11,320,377 B2 | 5/2022 | Chen et al. |
| 11,348,631 B2 | 5/2022 | Wu et al. |
| 11,380,382 B2 | 7/2022 | Zhang et al. |
| 11,417,383 B2 | 8/2022 | Jenkinson et al. |
| 11,532,346 B2 | 12/2022 | Brown et al. |

(56) References Cited

U.S. PATENT DOCUMENTS

| | | |
|---|---|---|
| 11,557,331 B2 | 1/2023 | Mitsubori et al. |
| 11,610,622 B2 | 3/2023 | Rehmeyer et al. |
| 11,615,831 B2 | 3/2023 | Yamamoto |
| 11,626,152 B2 | 4/2023 | Wu et al. |
| 11,688,452 B2 * | 6/2023 | Nale .................. G06F 3/0659 |
| | | 365/149 |
| 11,715,512 B2 | 8/2023 | Li et al. |
| 11,749,331 B2 | 9/2023 | Wu et al. |
| 11,798,610 B2 | 10/2023 | Cowles et al. |
| 11,810,612 B2 | 11/2023 | Roberts |
| 11,935,576 B2 | 3/2024 | Ishikawa et al. |
| 11,955,158 B2 | 4/2024 | Brown et al. |
| 12,002,501 B2 | 6/2024 | Noguchi |
| 2001/0008498 A1 | 7/2001 | Ooishi |
| 2002/0026613 A1 | 2/2002 | Niiro |
| 2002/0181301 A1 | 12/2002 | Takahashi et al. |
| 2002/0191467 A1 | 12/2002 | Matsumoto et al. |
| 2003/0026161 A1 | 2/2003 | Yamaguchi et al. |
| 2003/0063512 A1 | 4/2003 | Takahashi et al. |
| 2003/0067825 A1 | 4/2003 | Shimano et al. |
| 2003/0081483 A1 | 5/2003 | De et al. |
| 2003/0123301 A1 | 7/2003 | Jang et al. |
| 2003/0161208 A1 | 8/2003 | Nakashima et al. |
| 2003/0193829 A1 | 10/2003 | Morgan et al. |
| 2003/0231540 A1 | 12/2003 | Lazar et al. |
| 2004/0004856 A1 | 1/2004 | Sakimura et al. |
| 2004/0008544 A1 | 1/2004 | Shinozaki et al. |
| 2004/0022093 A1 | 2/2004 | Lee |
| 2004/0024955 A1 | 2/2004 | Patel |
| 2004/0114446 A1 | 6/2004 | Takahashi et al. |
| 2004/0130959 A1 | 7/2004 | Kawaguchi |
| 2004/0184323 A1 | 9/2004 | Mori et al. |
| 2004/0218431 A1 | 11/2004 | Chung et al. |
| 2005/0002268 A1 | 1/2005 | Otsuka et al. |
| 2005/0041502 A1 | 2/2005 | Perner |
| 2005/0105362 A1 | 5/2005 | Choi et al. |
| 2005/0108460 A1 | 5/2005 | David |
| 2005/0213408 A1 | 9/2005 | Shieh |
| 2005/0243627 A1 | 11/2005 | Lee et al. |
| 2005/0249009 A1 | 11/2005 | Shieh |
| 2005/0265104 A1 | 12/2005 | Remaklus et al. |
| 2006/0018174 A1 | 1/2006 | Park et al. |
| 2006/0083099 A1 | 4/2006 | Bae et al. |
| 2006/0087903 A1 | 4/2006 | Riho et al. |
| 2006/0104139 A1 | 5/2006 | Hur et al. |
| 2006/0176744 A1 | 8/2006 | Stave |
| 2006/0198220 A1 | 9/2006 | Yoon et al. |
| 2006/0215474 A1 | 9/2006 | Hokenmaier |
| 2006/0233012 A1 | 10/2006 | Sekiguchi et al. |
| 2006/0262616 A1 | 11/2006 | Chen |
| 2006/0262617 A1 | 11/2006 | Lee |
| 2006/0268643 A1 | 11/2006 | Schreck et al. |
| 2007/0002651 A1 | 1/2007 | Lee |
| 2007/0008799 A1 | 1/2007 | Dono et al. |
| 2007/0014175 A1 | 1/2007 | Min et al. |
| 2007/0028068 A1 | 2/2007 | Golding et al. |
| 2007/0030746 A1 | 2/2007 | Best et al. |
| 2007/0033338 A1 | 2/2007 | Tsern |
| 2007/0033339 A1 | 2/2007 | Best et al. |
| 2007/0106838 A1 | 5/2007 | Choi |
| 2007/0147154 A1 | 6/2007 | Lee |
| 2007/0165042 A1 | 7/2007 | Yagi |
| 2007/0171750 A1 | 7/2007 | Oh |
| 2007/0237016 A1 | 10/2007 | Miyamoto et al. |
| 2007/0263442 A1 | 11/2007 | Cornwell et al. |
| 2007/0297252 A1 | 12/2007 | Singh |
| 2008/0028137 A1 | 1/2008 | Schakel et al. |
| 2008/0028260 A1 | 1/2008 | Oyagi et al. |
| 2008/0031068 A1 | 2/2008 | Yoo et al. |
| 2008/0126893 A1 | 5/2008 | Harrand et al. |
| 2008/0130394 A1 | 6/2008 | Dono et al. |
| 2008/0181048 A1 | 7/2008 | Han |
| 2008/0212386 A1 | 9/2008 | Riho |
| 2008/0224742 A1 | 9/2008 | Pomichter |
| 2008/0253212 A1 | 10/2008 | Iida et al. |
| 2008/0253213 A1 | 10/2008 | Sato et al. |
| 2008/0266990 A1 | 10/2008 | Loeffler |
| 2008/0270683 A1 | 10/2008 | Barth et al. |
| 2008/0306723 A1 | 12/2008 | De et al. |
| 2008/0316845 A1 | 12/2008 | Wang et al. |
| 2009/0021999 A1 | 1/2009 | Tanimura et al. |
| 2009/0052264 A1 | 2/2009 | Hong et al. |
| 2009/0059641 A1 | 3/2009 | Jeddeloh |
| 2009/0073760 A1 | 3/2009 | Betser et al. |
| 2009/0147606 A1 | 6/2009 | Daniel |
| 2009/0161468 A1 | 6/2009 | Fujioka |
| 2009/0168571 A1 | 7/2009 | Pyo et al. |
| 2009/0185440 A1 | 7/2009 | Lee |
| 2009/0201752 A1 | 8/2009 | Riho et al. |
| 2009/0228739 A1 | 9/2009 | Cohen et al. |
| 2009/0251971 A1 | 10/2009 | Futatsuyama |
| 2009/0296510 A1 | 12/2009 | Lee et al. |
| 2010/0005217 A1 | 1/2010 | Jeddeloh |
| 2010/0005376 A1 | 1/2010 | Laberge et al. |
| 2010/0061153 A1 | 3/2010 | Yen et al. |
| 2010/0074042 A1 | 3/2010 | Fukuda et al. |
| 2010/0097870 A1 | 4/2010 | Kim et al. |
| 2010/0110809 A1 | 5/2010 | Kobayashi et al. |
| 2010/0110810 A1 | 5/2010 | Kobayashi |
| 2010/0124138 A1 | 5/2010 | Lee et al. |
| 2010/0128547 A1 | 5/2010 | Kagami |
| 2010/0131812 A1 | 5/2010 | Mohammad |
| 2010/0141309 A1 | 6/2010 | Lee |
| 2010/0157693 A1 | 6/2010 | Wai et al. |
| 2010/0182862 A1 | 7/2010 | Teramoto |
| 2010/0182863 A1 | 7/2010 | Fukiage |
| 2010/0329069 A1 | 12/2010 | Ito et al. |
| 2011/0026290 A1 | 2/2011 | Noda et al. |
| 2011/0055495 A1 | 3/2011 | Remaklus, Jr. et al. |
| 2011/0069572 A1 | 3/2011 | Lee et al. |
| 2011/0122987 A1 | 5/2011 | Neyer |
| 2011/0134715 A1 | 6/2011 | Norman |
| 2011/0216614 A1 | 9/2011 | Hosoe |
| 2011/0225355 A1 | 9/2011 | Kajigaya |
| 2011/0299352 A1 | 12/2011 | Fujishiro et al. |
| 2011/0310648 A1 | 12/2011 | Iwamoto et al. |
| 2012/0014199 A1 | 1/2012 | Narui |
| 2012/0059984 A1 | 3/2012 | Kang et al. |
| 2012/0151131 A1 | 6/2012 | Kilmer et al. |
| 2012/0155173 A1 | 6/2012 | Lee et al. |
| 2012/0155206 A1 | 6/2012 | Kodama et al. |
| 2012/0213021 A1 | 8/2012 | Riho et al. |
| 2012/0254472 A1 | 10/2012 | Ware et al. |
| 2012/0287727 A1 | 11/2012 | Wang |
| 2012/0307582 A1 | 12/2012 | Marumoto et al. |
| 2012/0327734 A1 | 12/2012 | Sato |
| 2013/0003467 A1 | 1/2013 | Klein |
| 2013/0003477 A1 | 1/2013 | Park et al. |
| 2013/0028034 A1 | 1/2013 | Fujisawa |
| 2013/0051157 A1 | 2/2013 | Park |
| 2013/0051171 A1 | 2/2013 | Porter et al. |
| 2013/0077423 A1 | 3/2013 | Lee |
| 2013/0173971 A1 | 7/2013 | Zimmerman |
| 2013/0254475 A1 | 9/2013 | Perego et al. |
| 2013/0279284 A1 | 10/2013 | Jeong |
| 2013/0304982 A1 | 11/2013 | Jung et al. |
| 2014/0006700 A1 | 1/2014 | Schaefer et al. |
| 2014/0006703 A1 | 1/2014 | Bains et al. |
| 2014/0006704 A1 | 1/2014 | Greenfield et al. |
| 2014/0013169 A1 | 1/2014 | Kobla et al. |
| 2014/0013185 A1 | 1/2014 | Kobla et al. |
| 2014/0016422 A1 | 1/2014 | Kim et al. |
| 2014/0022858 A1 | 1/2014 | Chen et al. |
| 2014/0043888 A1 | 2/2014 | Chen et al. |
| 2014/0050004 A1 | 2/2014 | Mochida |
| 2014/0078841 A1 | 3/2014 | Chopra |
| 2014/0078842 A1 | 3/2014 | Oh et al. |
| 2014/0089576 A1 | 3/2014 | Bains et al. |
| 2014/0089758 A1 | 3/2014 | Kwok et al. |
| 2014/0095780 A1 | 4/2014 | Bains et al. |
| 2014/0095786 A1 | 4/2014 | Moon et al. |
| 2014/0119091 A1 | 5/2014 | You et al. |
| 2014/0143473 A1 | 5/2014 | Kim et al. |
| 2014/0156923 A1 | 6/2014 | Bains et al. |

(56) References Cited

U.S. PATENT DOCUMENTS

| | | |
|---|---|---|
| 2014/0169114 A1 | 6/2014 | Oh |
| 2014/0177370 A1 | 6/2014 | Halbert et al. |
| 2014/0181453 A1 | 6/2014 | Jayasena et al. |
| 2014/0185403 A1 | 7/2014 | Lai |
| 2014/0189228 A1 | 7/2014 | Greenfield et al. |
| 2014/0219042 A1 | 8/2014 | Yu et al. |
| 2014/0219043 A1 | 8/2014 | Jones et al. |
| 2014/0237307 A1 | 8/2014 | Kobla et al. |
| 2014/0241099 A1 | 8/2014 | Seo et al. |
| 2014/0254298 A1 | 9/2014 | Dally |
| 2014/0281206 A1 | 9/2014 | Crawford et al. |
| 2014/0281207 A1 | 9/2014 | Mandava et al. |
| 2014/0293725 A1 | 10/2014 | Best et al. |
| 2014/0321226 A1 | 10/2014 | Pyeon |
| 2015/0016203 A1 | 1/2015 | Sriramagiri et al. |
| 2015/0036445 A1 | 2/2015 | Yoshida et al. |
| 2015/0049566 A1 | 2/2015 | Lee et al. |
| 2015/0049567 A1 | 2/2015 | Chi |
| 2015/0055420 A1 | 2/2015 | Bell et al. |
| 2015/0078112 A1 | 3/2015 | Huang |
| 2015/0085564 A1 | 3/2015 | Yoon et al. |
| 2015/0089326 A1 | 3/2015 | Joo et al. |
| 2015/0092508 A1 | 4/2015 | Bains |
| 2015/0109871 A1 | 4/2015 | Bains et al. |
| 2015/0120999 A1 | 4/2015 | Kim et al. |
| 2015/0134897 A1 | 5/2015 | Sriramagiri et al. |
| 2015/0155025 A1 | 6/2015 | Lee et al. |
| 2015/0162064 A1 | 6/2015 | Oh et al. |
| 2015/0162067 A1 | 6/2015 | Kim et al. |
| 2015/0170728 A1 | 6/2015 | Jung et al. |
| 2015/0199126 A1 | 7/2015 | Jayasena et al. |
| 2015/0206572 A1 | 7/2015 | Lim et al. |
| 2015/0213872 A1 | 7/2015 | Mazumder et al. |
| 2015/0243339 A1 | 8/2015 | Bell et al. |
| 2015/0255140 A1 | 9/2015 | Song |
| 2015/0279441 A1 | 10/2015 | Greenberg et al. |
| 2015/0279442 A1 | 10/2015 | Hwang |
| 2015/0294711 A1 | 10/2015 | Gaither et al. |
| 2015/0340077 A1 | 11/2015 | Akamatsu |
| 2015/0356048 A1 | 12/2015 | King |
| 2015/0380073 A1 | 12/2015 | Joo et al. |
| 2016/0019940 A1 | 1/2016 | Jang et al. |
| 2016/0027498 A1 | 1/2016 | Ware et al. |
| 2016/0027531 A1 | 1/2016 | Jones et al. |
| 2016/0027532 A1 | 1/2016 | Kim |
| 2016/0042782 A1 | 2/2016 | Narui et al. |
| 2016/0070483 A1 | 3/2016 | Yoon et al. |
| 2016/0078846 A1 | 3/2016 | Liu et al. |
| 2016/0078911 A1 | 3/2016 | Fujiwara et al. |
| 2016/0086649 A1 | 3/2016 | Hong et al. |
| 2016/0093402 A1 | 3/2016 | Kitagawa et al. |
| 2016/0125931 A1 | 5/2016 | Doo et al. |
| 2016/0133314 A1 | 5/2016 | Hwang et al. |
| 2016/0155491 A1 | 6/2016 | Roberts et al. |
| 2016/0180917 A1 | 6/2016 | Chishti et al. |
| 2016/0180921 A1 | 6/2016 | Jeong |
| 2016/0196863 A1 | 7/2016 | Shin et al. |
| 2016/0202926 A1 | 7/2016 | Benedict |
| 2016/0224262 A1 | 8/2016 | Mandava et al. |
| 2016/0225433 A1 | 8/2016 | Bains et al. |
| 2016/0336060 A1 | 11/2016 | Shin |
| 2016/0343423 A1 | 11/2016 | Shido |
| 2017/0011792 A1 | 1/2017 | Oh et al. |
| 2017/0052722 A1 | 2/2017 | Ware et al. |
| 2017/0062038 A1 | 3/2017 | Doo et al. |
| 2017/0076779 A1 | 3/2017 | Bains et al. |
| 2017/0092350 A1 | 3/2017 | Halbert et al. |
| 2017/0110177 A1 | 4/2017 | Lee et al. |
| 2017/0111792 A1 | 4/2017 | Correia Fernandes et al. |
| 2017/0117030 A1 | 4/2017 | Fisch et al. |
| 2017/0133085 A1 | 5/2017 | Kim et al. |
| 2017/0133108 A1 | 5/2017 | Lee et al. |
| 2017/0140807 A1 | 5/2017 | Sun et al. |
| 2017/0140810 A1 | 5/2017 | Choi et al. |
| 2017/0140811 A1 | 5/2017 | Joo |
| 2017/0146598 A1 | 5/2017 | Kim et al. |
| 2017/0148504 A1 | 5/2017 | Saifuddin et al. |
| 2017/0177246 A1 | 6/2017 | Miller et al. |
| 2017/0186481 A1 | 6/2017 | Oh et al. |
| 2017/0213586 A1 | 7/2017 | Kang et al. |
| 2017/0221546 A1 | 8/2017 | Loh et al. |
| 2017/0263305 A1 | 9/2017 | Cho |
| 2017/0269861 A1 | 9/2017 | Lu et al. |
| 2017/0287547 A1 | 10/2017 | Ito et al. |
| 2017/0323675 A1 | 11/2017 | Jones et al. |
| 2017/0345482 A1 | 11/2017 | Balakrishnan |
| 2017/0352404 A1 | 12/2017 | Lee et al. |
| 2018/0005690 A1 | 1/2018 | Morgan et al. |
| 2018/0025770 A1 | 1/2018 | Ito et al. |
| 2018/0025772 A1 | 1/2018 | Lee et al. |
| 2018/0025773 A1 | 1/2018 | Bains et al. |
| 2018/0033479 A1 | 2/2018 | Lea et al. |
| 2018/0047110 A1 | 2/2018 | Blackman et al. |
| 2018/0061476 A1 | 3/2018 | Kim |
| 2018/0061483 A1 | 3/2018 | Morgan |
| 2018/0061485 A1 | 3/2018 | Joo |
| 2018/0075927 A1 | 3/2018 | Jeong et al. |
| 2018/0082736 A1 | 3/2018 | Jung |
| 2018/0082737 A1 | 3/2018 | Lee |
| 2018/0096719 A1 | 4/2018 | Tomishima et al. |
| 2018/0102776 A1 | 4/2018 | Chandrasekar et al. |
| 2018/0107417 A1 | 4/2018 | Shechter et al. |
| 2018/0108401 A1 | 4/2018 | Choi et al. |
| 2018/0114561 A1 | 4/2018 | Fisch et al. |
| 2018/0114565 A1 | 4/2018 | Lee |
| 2018/0122454 A1 | 5/2018 | Lee et al. |
| 2018/0130506 A1 | 5/2018 | Kang et al. |
| 2018/0137005 A1 | 5/2018 | Wu et al. |
| 2018/0158504 A1 | 6/2018 | Akamatsu |
| 2018/0158507 A1 | 6/2018 | Bang |
| 2018/0182445 A1 | 6/2018 | Lee et al. |
| 2018/0190340 A1 | 7/2018 | Kim et al. |
| 2018/0218767 A1 | 8/2018 | Wolff |
| 2018/0226119 A1 | 8/2018 | Kim et al. |
| 2018/0233197 A1 | 8/2018 | Laurent |
| 2018/0240511 A1 | 8/2018 | Yoshida et al. |
| 2018/0247876 A1 | 8/2018 | Kim et al. |
| 2018/0254078 A1 | 9/2018 | We et al. |
| 2018/0261268 A1 | 9/2018 | Hyun et al. |
| 2018/0276150 A1 | 9/2018 | Eckert et al. |
| 2018/0285007 A1 | 10/2018 | Franklin et al. |
| 2018/0294028 A1 | 10/2018 | Lee et al. |
| 2018/0308539 A1 | 10/2018 | Ito et al. |
| 2018/0341553 A1 | 11/2018 | Koudele et al. |
| 2019/0013059 A1 | 1/2019 | Akamatsu |
| 2019/0043558 A1 | 2/2019 | Suh et al. |
| 2019/0051344 A1 | 2/2019 | Bell et al. |
| 2019/0065087 A1 | 2/2019 | Li et al. |
| 2019/0066759 A1 | 2/2019 | Nale |
| 2019/0066766 A1 | 2/2019 | Lee |
| 2019/0088315 A1 | 3/2019 | Saenz et al. |
| 2019/0088316 A1 | 3/2019 | Inuzuka et al. |
| 2019/0103147 A1 | 4/2019 | Jones et al. |
| 2019/0115069 A1 | 4/2019 | Lai |
| 2019/0122723 A1 | 4/2019 | Ito et al. |
| 2019/0129651 A1 | 5/2019 | Wuu et al. |
| 2019/0130960 A1 | 5/2019 | Kim |
| 2019/0130961 A1 | 5/2019 | Bell et al. |
| 2019/0147964 A1 | 5/2019 | Yun et al. |
| 2019/0161341 A1 | 5/2019 | Howe |
| 2019/0190341 A1 | 6/2019 | Beisele et al. |
| 2019/0196730 A1 | 6/2019 | Imran |
| 2019/0198078 A1 | 6/2019 | Hoang et al. |
| 2019/0198099 A1 | 6/2019 | Mirichigni et al. |
| 2019/0205253 A1 | 7/2019 | Roberts |
| 2019/0228810 A1 | 7/2019 | Jones et al. |
| 2019/0228815 A1 | 7/2019 | Morohashi et al. |
| 2019/0237132 A1 | 8/2019 | Morohashi |
| 2019/0252020 A1 | 8/2019 | Rios et al. |
| 2019/0267077 A1 | 8/2019 | Ito et al. |
| 2019/0279706 A1 | 9/2019 | Kim |
| 2019/0294348 A1 | 9/2019 | Ware et al. |
| 2019/0333573 A1 | 10/2019 | Shin et al. |
| 2019/0347019 A1 | 11/2019 | Shin et al. |

(56) References Cited

U.S. PATENT DOCUMENTS

| | | |
|---|---|---|
| 2019/0348100 A1 | 11/2019 | Smith et al. |
| 2019/0348102 A1 | 11/2019 | Smith et al. |
| 2019/0348103 A1 | 11/2019 | Jeong et al. |
| 2019/0362774 A1 | 11/2019 | Kuramori et al. |
| 2019/0385661 A1 | 12/2019 | Koo et al. |
| 2019/0385667 A1 | 12/2019 | Morohashi et al. |
| 2019/0385668 A1 | 12/2019 | Fujioka et al. |
| 2019/0385670 A1 | 12/2019 | Notani et al. |
| 2019/0386557 A1 | 12/2019 | Wang et al. |
| 2019/0391760 A1 | 12/2019 | Miura et al. |
| 2019/0392886 A1 | 12/2019 | Cox et al. |
| 2020/0005857 A1 | 1/2020 | Ito et al. |
| 2020/0051616 A1 | 2/2020 | Cho |
| 2020/0075086 A1 | 3/2020 | Hou et al. |
| 2020/0082873 A1 | 3/2020 | Wolff |
| 2020/0126611 A1 | 4/2020 | Riho et al. |
| 2020/0135263 A1 | 4/2020 | Brown et al. |
| 2020/0143871 A1 | 5/2020 | Kim et al. |
| 2020/0176050 A1 | 6/2020 | Ito et al. |
| 2020/0185026 A1 | 6/2020 | Yun et al. |
| 2020/0194050 A1 | 6/2020 | Akamatsu |
| 2020/0194056 A1 | 6/2020 | Sakurai et al. |
| 2020/0202921 A1 | 6/2020 | Morohashi et al. |
| 2020/0210278 A1 | 7/2020 | Rooney et al. |
| 2020/0211632 A1 | 7/2020 | Noguchi |
| 2020/0211633 A1 | 7/2020 | Okuma |
| 2020/0211634 A1 | 7/2020 | Ishikawa et al. |
| 2020/0219555 A1 | 7/2020 | Rehmeyer |
| 2020/0219556 A1 | 7/2020 | Ishikawa et al. |
| 2020/0265888 A1 | 8/2020 | Ito et al. |
| 2020/0273517 A1 | 8/2020 | Yamamoto |
| 2020/0273518 A1 | 8/2020 | Raad et al. |
| 2020/0279599 A1 | 9/2020 | Ware et al. |
| 2020/0294569 A1 | 9/2020 | Wu et al. |
| 2020/0294576 A1 | 9/2020 | Brown et al. |
| 2020/0321049 A1 | 10/2020 | Meier et al. |
| 2020/0381040 A1 | 12/2020 | Penney et al. |
| 2020/0388324 A1 | 12/2020 | Rehmeyer et al. |
| 2020/0388325 A1 | 12/2020 | Cowles et al. |
| 2020/0395063 A1 | 12/2020 | Rehmeyer |
| 2021/0057021 A1 | 2/2021 | Wu et al. |
| 2021/0057022 A1 | 2/2021 | Jenkinson et al. |
| 2021/0109577 A1 | 4/2021 | Mandava et al. |
| 2021/0118491 A1 | 4/2021 | Li et al. |
| 2021/0166752 A1 | 6/2021 | Noguchi |
| 2021/0183433 A1 | 6/2021 | Jenkinson et al. |
| 2021/0183435 A1 | 6/2021 | Meier et al. |
| 2021/0225431 A1 | 7/2021 | Rehmeyer et al. |
| 2021/0304813 A1 | 9/2021 | Cowles et al. |
| 2021/0335411 A1 | 10/2021 | Wu et al. |
| 2021/0350844 A1 | 11/2021 | Morohashi et al. |
| 2021/0406170 A1 | 12/2021 | Jung et al. |
| 2022/0059153 A1 | 2/2022 | Zhang et al. |
| 2022/0059158 A1 | 2/2022 | Wu et al. |
| 2022/0091784 A1 | 3/2022 | Brandl |
| 2022/0093165 A1 | 3/2022 | Mitsubori et al. |
| 2022/0165328 A1 | 5/2022 | Ishikawa et al. |
| 2022/0189537 A1 | 6/2022 | Kim |
| 2022/0189539 A1 | 6/2022 | Li et al. |
| 2022/0199144 A1 | 6/2022 | Roberts |
| 2022/0270670 A1 | 8/2022 | Wu et al. |
| 2023/0105151 A1 | 4/2023 | Brown et al. |
| 2023/0352076 A1 | 11/2023 | He et al. |
| 2024/0062798 A1 | 2/2024 | Cowles et al. |
| 2024/0071460 A1 | 2/2024 | Noguchi |

FOREIGN PATENT DOCUMENTS

| | | | |
|---|---|---|---|
| CN | 1879173 A | 12/2006 | |
| CN | 101026003 A | 8/2007 | |
| CN | 101038785 A | 9/2007 | |
| CN | 101047025 A | 10/2007 | |
| CN | 101067972 A | 11/2007 | |
| CN | 101211653 A | 7/2008 | |
| CN | 101243450 A | 8/2008 | |
| CN | 102301423 A | 12/2011 | |
| CN | 102663155 A | 9/2012 | |
| CN | 102931187 A | 2/2013 | |
| CN | 104350546 A | 2/2015 | |
| CN | 104733035 A | 6/2015 | |
| CN | 104737234 A | 6/2015 | |
| CN | 104781885 A | 7/2015 | |
| CN | 104981874 A | 10/2015 | |
| CN | 105378847 A | 3/2016 | |
| CN | 105529047 A | 4/2016 | |
| CN | 106710621 A | 5/2017 | |
| CN | 107025927 A | 8/2017 | |
| CN | 107871516 A | 4/2018 | |
| CN | 107919150 A | 4/2018 | |
| CN | 108154895 A | 6/2018 | |
| CN | 108242248 A | 7/2018 | |
| CN | 109949844 A | 6/2019 | |
| CN | 110520929 * | 11/2019 | ....... G11C 11/40618 |
| CN | 114121076 * | 3/2022 | ......... G11C 11/4074 |
| JP | S6282887 A | 4/1987 | |
| JP | 2005-216429 A | 8/2005 | |
| JP | 2011-258259 A | 12/2011 | |
| JP | 4911510 B2 | 1/2012 | |
| JP | 2013-004158 A | 1/2013 | |
| JP | 6281030 B1 | 1/2018 | |
| KR | 20030063947 A | 7/2003 | |
| KR | 20070109104 A | 11/2007 | |
| KR | 20160134411 A | 11/2016 | |
| KR | 20170053373 A | 5/2017 | |
| KR | 20170093053 A | 8/2017 | |
| KR | 20180011642 A | 2/2018 | |
| KR | 20180101647 A | 9/2018 | |
| KR | 20190046572 A | 5/2019 | |
| TW | 201801079 A | 1/2018 | |
| WO | 2014120477 | 8/2014 | |
| WO | 2015030991 A1 | 3/2015 | |
| WO | 2017171927 A1 | 10/2017 | |
| WO | 2019222960 A1 | 11/2019 | |
| WO | 2020010010 A1 | 1/2020 | |
| WO | 2020117686 A1 | 6/2020 | |
| WO | 2020247163 A1 | 12/2020 | |
| WO | 2020247639 A1 | 12/2020 | |

OTHER PUBLICATIONS

International Application No. PCT/US20/23689, titled "Semiconductor Device Having Cam That Stores Address Signals", dated Mar. 19, 2020, pp. al pages of application as filed.

U.S. Appl. No. 16/797,658, titles "Apparatuses and Methods for Controlling Refresh Operations", filed Feb. 21, 2020, pp. al pages of application as filed.

U.S. Appl. No. 16/818,981 titled "Apparatuses and Methods for Staggered Timing of Targeted Refresh Operations", filed Mar. 13, 2020, pp. al pages of application as filed.

U.S. Appl. No. 16/824,460, titled "Semiconductor Device Performing Row Hammer Refresh Operation", dated Mar. 19, 2020, pp. al pages of application as filed.

U.S. Appl. No. 16/025,844, titled "Apparatus and Methods for Triggering Row Hammer Address Sampling", filed Jul. 2, 2018, pp. al pages of application as filed.

U.S. Appl. No. 16/783,063, titled "Apparatus and Methods for Triggering Row Hammer Address Sampling", dated Feb. 5, 2020, pp. al pages of application as filed.

U.S. Appl. No. 16/805,197, titled "Apparatuses and Methods for Calculating Row Hammer Refresh Addresses in a Semiconductor Device", dated Feb. 28, 2020, pp. al pages of application as filed.

U.S. Appl. No. 16/232,837, titled "Apparatuses and Methods for Distributed Targeted Refresh Operations", filed Dec. 26, 2018, pp. al pages of application as filed.

U.S. Appl. No. 16/818,989, titled "Semiconductor Device Performing Row Hammer Refresh Operation", dated Mar. 13, 2020, pp. al pages of application as filed.

U.S. Appl. No. 16/268,818, titled "Apparatuses and Methods for Managing Row Access Counts", filed Feb. 6, 2019, pp. al pages of application as filed.

(56) References Cited

OTHER PUBLICATIONS

U.S. Appl. No. 16/286,187 titled "Apparatuses and Methods for Memory Mat Refresh Sequencing", filed Feb. 26, 2019, pp. al pages of application as filed.
U.S. Appl. No. 16/084,119, titled "Apparatuses and Methods for Pure-Time, Self Adopt Sampling for Row Hammer Refresh Sampling", filed Sep. 11, 2018, pp. al pages of application as filed.
U.S. Appl. No. 16/886,284 titled "Apparatuses and Methods for Access Based Refresh Timing", filed May 28, 2020, pp. al pages of application as filed.
U.S. Appl. No. 16/886,284, titled "Apparatuses and Methods for Access Based Refresh Timing", dated May 28, 2020, pp. al pages of application as filed.
U.S. Appl. No. 16/358,587, titled "Semiconductor Device Having Cam That Stores Address Signals", dated Mar. 19, 2019, pp. al pages of application as filed.
U.S. Appl. No. 16/375,716 titled "Apparatuses and Methods for Staggered Timing of Targeted Refresh Operations", filed Apr. 4, 2019, pp. al pages of application as filed.
U.S. Appl. No. 16/411,573 titled "Apparatuses, Systems, and Methods for a Content Addressable Memory Cell", filed May 14, 2019, pp. al pages of application as filed.
U.S. Appl. No. 16/428,625 titled "Apparatuses and Methods for Tracking Victim Rows", filed May 31, 2019, pp. al pages of application as filed.
U.S. Appl. No. 16/432,604 titled "Apparatuses and Methods for Staggered Timing of Skipped Refresh Operations", filed Jun. 5, 2019, pp. al pages of application as filed.
U.S. Appl. No. 17/008,396 titled "Apparatuses and Methods for Staggered Timing of Targeted Refresh Operations", filed Aug. 31, 2020, pp. al pages of application as filed.
U.S. Appl. No. 16/513,400 titled "Apparatuses and Methods for Tracking Row Accesses", filed Jul. 16, 2019, pp. al pages of application as filed.
U.S. Appl. No. 16/548,027 titled "Apparatuses, Systems, and Methods for Analog Row Access Rate Determination", filed Aug. 22, 2019, pp. al pages of application as filed.
U.S. Appl. No. 16/549,942 titled "Apparatuses and Methods for Lossy Row Access Counting", filed Aug. 23, 2019, pp. al pages of application as filed.
U.S. Appl. No. 16/546,152 titled "Apparatuses and Methods for Analog Row Access Tracking", filed Aug. 20, 2019, pp. al pages of application as filed.
U.S. Appl. No. 16/549,411 titled "Apparatuses and Methods for Dynamic Refresh Allocation", filed Aug. 23, 2019, pp. al pages of application as filed.
U.S. Appl. 16/655,110 titled "Apparatuses and Methods for Dynamic Targeted Refresh Steals", filed Oct. 16, 2019, pp. al pages of application as filed.
U.S. Appl. No. 17/186,913 titled "Apparatuses and Methods for Dynamic Refresh Allocation", filed Feb. 26, 2021, pp. al pages of application as filed.
U.S. Appl. No. 17/187,002 titled "Apparatuses and Methods for Staggered Timing of Targeted Refresh Operations", filed Feb. 26, 2021, pp. al pages of application as filed.
U.S. Appl. No. 17/347,957 titled "Apparatuses and Methods for Controlling Steal Rates", filed Jun. 15, 2021, pp. al pages of application as filed.
International Application No. PCT/US19/40169 titled "Apparatus and Methods for Triggering Row Hammer Address Sampling", filed Jul. 1, 2019, pp. al pages of application as filed.
International Application No. PCT/US19/64028, titled "Semiconductor Device Performing Row Hammer Refresh Operation", dated Dec. 2, 2019, pp. al pages of application as filed.
International Application No. PCT/US20/26689, titled "Apparatuses and Methods for Staggered Timing of Targeted Refresh Operations", dated Apr. 3, 2020, pp. al pages of application as filed.
PCT Application No. PCT/US20/32931, titled "Apparatuses and Methods for Controlling Steal Rates", dated May 14, 2020, pp. al pages of application as filed.

U.S. Appl. No. 16/788,657, titled "Semiconductor Device Performing Row Hammer Refresh Operation", dated Feb. 12, 2020, pp. al pages of application as filed.
U.S. Appl. No. 17/324,621 titled "Apparatuses And Methods for Pure-Time, Self-Adopt Sampling For Row Hammer Refresh Sampling", filed May 19, 2021, pp. al pages of application as filed.
U.S. Appl. No. 15/881,256 entitled 'Apparatuses and Methods for Detecting a Row Hammer Attack With a Bandpass Filter', filed Jan. 26, 2018, pp. al pages of application as filed.
U.S. Appl. No. 17/662,733, titled "Apparatuses, Systems, and Methods for Identifying Victim Rows in a Memorydevice Which Cannot Be Simultaneously Refreshed", filed May 10, 2022, pp. al pages of application as filed.
U.S. Appl. No. 16/425,525 titled "Apparatuses And Methods For Tracking All Row Accesses", filed May 29, 2019, pp. al pages of application as filed.
U.S. Appl. No. 16/427,105 titled "Apparatuses And Methods For Priority Targeted Refresh Operations", filed May 30, 2019, pp. al pages of application as filed.
U.S. Appl. No. 16/427,140 titled "Apparatuses And Methods For Tracking Row Access Counts Between Multiple Register Stacks", filed May 30, 2019, pp. al pages of application as filed.
U.S. Appl. No. 16/437,811 titled "Apparatuses, Systems, And Methods For Determining Extremum Numerical Values", filed Jun. 11, 2019, pp. al pages of application as filed.
U.S. Appl. No. 16/537,981 titled "Apparatuses and Methods for Controlling Targeted Refresh Rates", filed Aug. 12, 2019, pp. al pages of application as filed.
U.S. Appl. No. 16/994,338 titled "Apparatuses, Systems, and Methods for Memory Directed Access Pause", filed Aug. 14, 2020, pp. al pages of application as filed.
U.S. Appl. No. 16/997,766 titled "Refresh Logic Circuit Layouts Thereof", filed Aug. 19, 2020, pp. al pages of application as filed.
U.S. Appl. No. 16/997,659 titled "Apparatuses, Systems, and Methods for Refresh Modes", filed Aug. 19, 2020, pp. al pages of application as filed.
U.S. Appl. No. 17/095,978 titled "Apparatuses and Methods for Controlling Refresh Timing", filed Nov. 12, 2020, pp. al pages of application as filed.
U.S. Appl. No. 17/127,654 titled "Apparatuses and Methods for Row Hammer Based Cache Lockdown", filed Dec. 18, 2020, pp. al pages of application as filed.
U.S. Appl. No. 17/175,485 titled "Apparatuses and Methods for Distributed Targeted Refresh Operations", filed Feb. 12, 2021, pp. al pages of application as filed.
U.S. Appl. No. 15/789,897, entitled "Apparatus and Methods for Refreshing Memory", filed Oct. 20, 2017, pp. al pages of application as filed.
U.S. Appl. No. 15/796,340, entitled: "Apparatus and Methods for Refreshing Memory", filed Oct. 27, 2017, pp. al pages of application as filed.
U.S. Appl. No. 16/012,679, titled "Apparatuses and Methods for Multiple Row Hammer Refresh Address Sequences", filed Jun. 19, 2018, pp. al pages of application as filed.
U.S. Appl. No. 16/020,863, titled "Semiconductor Device", filed Jun. 27, 2018, pp. al pages of application as filed.
U.S. Appl. No. 16/112,471 titled "Apparatuses and Methods for Controlling Refresh Operations", filed Aug. 24, 2018, pp. al pages of application as filed.
U.S. Appl. No. 16/160,801, titled "Apparatuses and Methods for Selective Row Refreshes", filed Oct. 15, 2018, pp. al pages of application as filed.
U.S. Appl. No. 16/176,932, titled "Apparatuses and Methods for Access Based Refresh Timing", filed Oct. 31, 2018, pp. al pages of application as filed.
U.S. Appl. No. 16/208,217, titled "Semiconductor Device Performing Row Hammer Refresh Operation", filed Dec. 3, 2018, pp. al pages of application as filed.
U.S. Appl. No. 16/230,300, titled "Apparatuses and Methods for Staggered Timing of Targeted Refresh Operations", filed Dec. 21, 2018, pp. al pages of application as filed.

(56) References Cited

OTHER PUBLICATIONS

U.S. Appl. No. 16/231,327 titled "Apparatuses And Methods for Selective Row Refreshes", filed Dec. 21, 2018, pp. al pages of application as filed.
U.S. Appl. No. 16/237,291, titled "Apparatus and Methods for Refreshing Memory", filed Dec. 31, 2018, pp. al pages of application as filed.
U.S. Appl. No. 16/290,730, titled "Semiconductor Device Performing Row Hammer Refresh Operation", filed Mar. 1, 2019, pp. al pages of application as filed.
U.S. Appl. No. 16/374,623, titled "Semiconductor Device Performing Row Hammer Refresh Operation", filed Apr. 3, 2019, pp. al pages of application as filed.
U.S. Appl. No. 16/411,698 title "Semiconductor Device", filed May 14, 2019, pp. al pages of application as filed.
U.S. Appl. No. 16/427,330 titled "Apparatuses and Methods for Storing Victim Row Data", filed May 30, 2019, pp. al pages of application as filed.
U.S. Appl. No. 16/431,641 titled "Apparatuses and Methods for Controlling Steal Rates", filed Jun. 4, 2019, pp. al pages of application as filed.
U.S. Appl. No. 16/682,606, titled "Apparatuses And Methods For Distributing Row Hammer Refresh Events Across A Memory Device", filed Nov. 13 2019, pp. al pages of application as filed.
U.S. Appl. No. 17/654,035, titled "Apparatuses and Methods for Dynamic Targeted Refresh Steals", filed Mar. 8, 2022; pp. all pages of application as filed.
U.S. Appl. No. 15/876,566 entitled 'Apparatuses and Methods for Calculating Row Hammer Refresh Addresses in a Semiconductor Device', filed Jan. 22, 2018, pp. al pages of application as filed.
U.S. Appl. No. 15/656,084, titled "Apparatuses And Methods For Targeted Refreshing Of Memory", filed Jul. 21, 20217, pp. al pages of application as filed.
U.S. Appl. No. 17/226,975, titled "Apparatuses and Methods for Staggered Timing of Skipped Refresh Operations", filed Apr. 9, 2021, pp. al pages of application as filed.
U.S. Appl. No. 16/459,520 titled "Apparatuses and Methods for Monitoring Word Line Accesses", filed Jul. 1, 2019, pp. al pages of application as filed.
PCT Application No. PCT/US 18/55821 "Apparatus and Methods for Refreshing Memory", filed Oct. 15, 2018, pp. al pages of application as filed.
U.S. Appl. No. 15/715,846, entitled "Semiconductor Device", filed Sep. 26, 2017, pp. al pages of application as filed.
U.S. Appl. No. 15/888,993, entitled "Apparatuses and Methods for Controlling Refresh Operations", filed Feb. 5, 2018, pp. al pages of application as filed.
U.S. Appl. No. 16/190,627 titled "Apparatuses and Methods for Targeted Refreshing of Memory", filed Nov. 14, 2018, pp. al pages of application as filed.
U.S. Appl. No. 17/030,018, titled "Apparatuses and Methods for Controlling Refresh Operations", filed Sep. 23, 2020, pp. al pages of application as filed.
U.S. Appl. No. 15/281,818, entitled: "Semiconductor Device", filed Sep. 30, 2016, pp. al pages of application as filed.
Kim, et al., "Flipping Bits in Memory Without Accessing Them: An Experimental Study of DRAM Disturbance Errors", IEEE, Jun. 2014, 12 pgs.
Kyungbae Park et al. "Experiments and Root Cause Analysis for Active-Precharge Hammering Fault in DDR3 SDRAM Under 3 X NM Technology";; Microelectronics Reliability: An Internet. Journal and World Abstracting Service; vol. 57, Dec. 23, 2015; pp. 39-46.
Anonymous: "Frequency—Wikipedia", Dec. 17, 2018, retrieved from URL: https://en.wikipedia.org/w/index.php?title=Frequency&oldid=874192848.
U.S. Appl. No. 17/731,645, titled "Apparatuses and Methods for Access Based Targeted Refresh Operations", filed Apr. 28, 2022; pp. all pages of application as filed.
U.S. Appl. No. 18/746,551 titled "Apparatuses and Methods for Direct Refresh Management Attack Identification" filed Jun. 18, 2024, pp. all pages of the application as filed.
U.S. Appl. No. 18/747,740, titled "Apparatuses and Methods Refresh Rate Register Adjustment Based On Refresh Queue" filed Jun. 19, 2024, pp. all pages of application as filed.
U.S. Appl. No. 18/774,730 titled "Apparatuses and Methods for Controller Signaling of Refresh Operations" filed Jul. 16, 2024, pp. all pages of the application as filed.

\* cited by examiner

APPARATUSES AND METHODS FOR ACCESS BASED REFRESH OPERATIONS

BACKGROUND

This disclosure relates generally to semiconductor devices, and more specifically to semiconductor memory devices. In particular, the disclosure relates to volatile memory, such as dynamic random access memory (DRAM). Information may be stored on individual memory cells of the memory as a physical signal (e.g., a charge on a capacitive element). When accessed, the memory cell may be coupled to a digit line (or bit line), and a voltage on the digit line may change based on the information stored in the coupled memory cell.

In volatile memory devices, the information may decay over time. To prevent information from being refreshed, the information may be periodically refreshed (e.g., by restoring the charge on a memory cell to an initial level). However, refresh operations may require time which could have otherwise been used for access operations in the memory.

DETAILED DESCRIPTION

Figure 1:
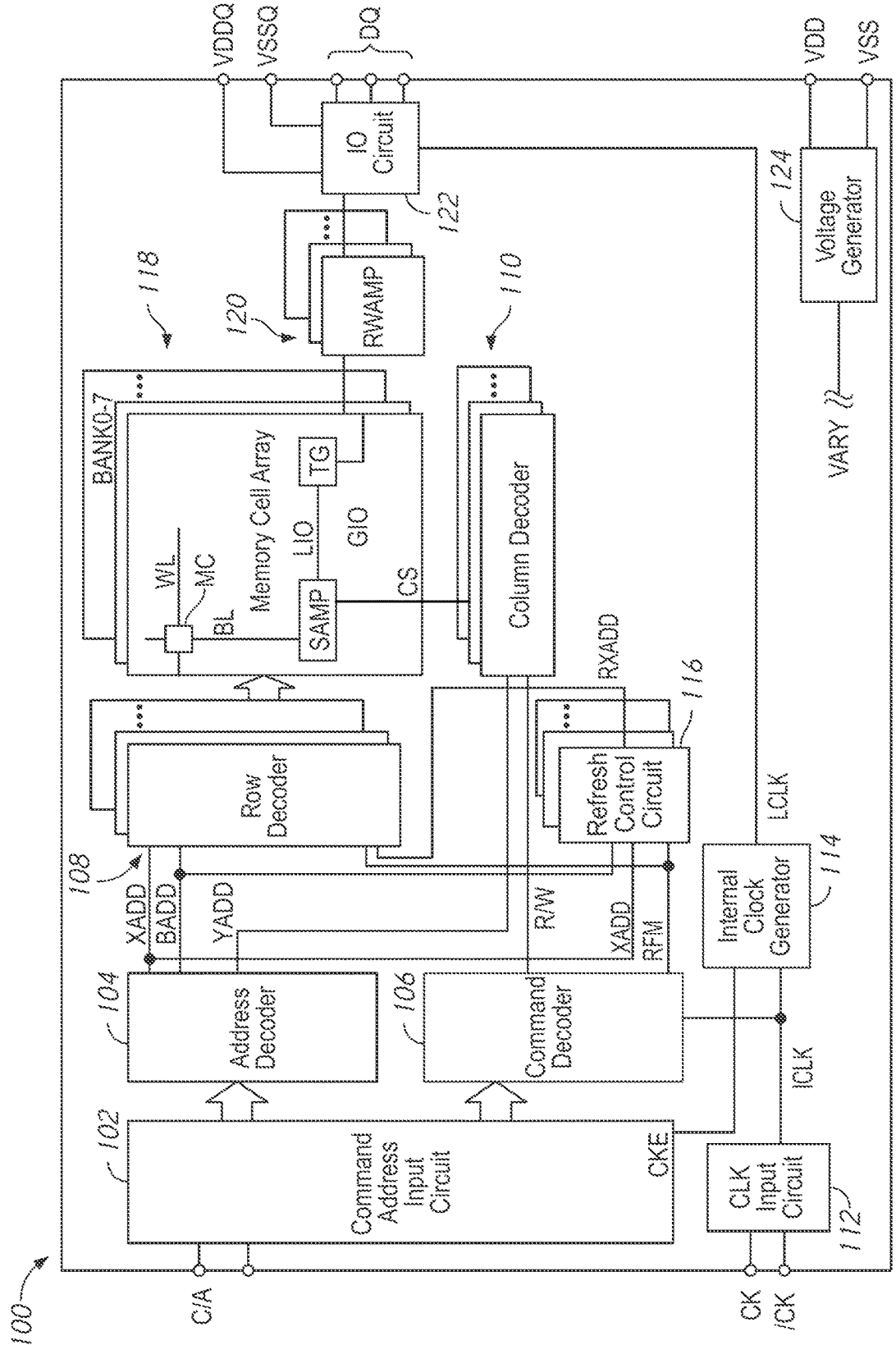
FIG. 1 is a block diagram of a semiconductor device according an embodiment of the disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Memory arrays may generally include a number of memory cells arranged at the intersection of word lines (rows) and bit lines/digit lines (columns). To prevent information from being lost, the memory may refresh memory cells on a row-by-row basis (or in sets of rows). Over the course of a refresh cycle, the memory may refresh the memory cells. The memory may have a refresh period, tREFI, which determines the maximum timing between refresh operations in order to ensure that all memory cells are refreshed over the course of a refresh cycle. For example, tREFI may be based on the expected time at which any individual memory cell needs to be refreshed divided by a total number of refresh operations in a refresh cycle (e.g., a number of rows or a number of rows refreshed per refresh operation). The refresh period tREFI may be relatively short (e.g., <1 μsec). Accordingly, refresh operations may need to be relatively frequently performed. This may be problematic in situations where the refresh operations prevent access operations.

The present disclosure is drawn to apparatuses, systems, and methods for access based refresh operations. The memory array may have a bank divided into two or more sub-banks. When a first sub-bank is accessed, a refresh operation may be performed on a second sub-bank of the same bank. If enough refreshes are performed in this fashion (e.g., if the first sub-bank is accessed enough), there may not be a need to generate a refresh signal. In this manner, refreshes may be performed while access operations are ongoing.

For example, each sub-bank may have a refresh control circuit. The refresh control circuit may have a refresh flag which is reset at the beginning of a tREFI period. While the flag is set, when an address is received as part of an access command, the refresh control circuit may determine if the address is associated with the sub-bank. If it is not, then a refresh address for the sub-bank is generated and word line(s) of the sub-bank are refreshed.

In some embodiments, each time a refresh is performed in this manner, a counter may be updated (e.g., incremented). When the counter reaches a threshold, the refresh flag may be unset. This may help prevent over refreshing of the sub-bank. In some embodiments, if the refresh flag is still set when the tREFI period ends (e.g., because not enough refresh operations were performed), then the refresh control circuit may send a refresh signal which causes refreshes to be performed. In some embodiments, the host (e.g., a controller of the memory) may monitor the accesses to the sub-banks, and may provide a refresh command which causes refreshes to be performed.

FIG. 1 is a block diagram of a semiconductor device according an embodiment of the disclosure. The semiconductor device 100 may be a semiconductor memory device, such as a DRAM device integrated on a single semiconductor chip.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. As explained in more detail herein, each bank may be further divided into two or more sub-banks. While embodiments where each bank includes two sub-banks are generally described herein, other embodiments may include more sub-banks per bank.

Each memory sub-bank includes a plurality of word lines WL, a plurality of bit lines BL, and a plurality of memory cells MC arranged at intersections of the plurality of word lines WL and the plurality of bit lines BL. The selection of the word line WL is performed by a row decoder 108 and the selection of the bit lines BL is performed by a column decoder 110. In the embodiment of FIG. 1, the row decoder 108 includes a respective row decoder for each memory bank and the column decoder 110 includes a respective column decoder for each memory bank. In some embodiments, components such as the row and column decoders and refresh control circuit 116 which are repeated on a per-bank basis may also include components which are repeated on a per-sub-bank basis. For example, there may be a refresh control circuit 116 for each sub-bank.

The bit lines BL are coupled to a respective sense amplifier (SAMP). Read data from the bit line BL is amplified by the sense amplifier SAMP, and transferred to read/write amplifiers 120 over local data lines (LIO), transfer gate (TG), and global data lines (GIO). Conversely, write data outputted from the read/write amplifiers 120 is transferred to the sense amplifier SAMP over the complementary main data lines GIO, the transfer gate TG, and the complementary local data lines LIO, and written in the memory cell MC coupled to the bit line BL.

The semiconductor device 100 may employ a plurality of external terminals, such as solder pads, that include command and address (C/A) terminals coupled to a command and address bus to receive commands and addresses, clock terminals to receive clocks CK and /CK, data terminals DQ coupled to a data bus to provide data, and power supply terminals to receive power supply potentials VDD, VSS, VDDQ, and VSSQ.

The clock terminals are supplied with external clocks CK and /CK that are provided to an input circuit 112. The external clocks may be complementary. The input circuit 112 generates an internal clock ICLK based on the CK and /CK clocks. The ICLK clock is provided to the command decoder 106 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data. The input/output circuit 122 may include a number of interface connections, each of which may be couplable to one of the DQ pads (e.g., the solder pads which may act as external connections to the device 100).

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The column decoder 110 may provide a column select signal CS, which may activate a selected one of the sense amplifiers SAMP. The address decoder 104 may also supply a decoded bank address BADD, which may indicate the bank of the memory array 118 containing the decoded row address XADD and column address YADD. The row address XADD may indicate the sub-bank within the bank indicated by BADD.

The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line.

The device 100 may receive an access command which is a read command. When a read command is received, and a bank address, a row address and a column address are timely supplied with the read command, read data is read from memory cells in the memory array 118 corresponding to the row address and column address. The read command is received by the command decoder 106, which provides internal commands so that read data from the memory array 118 is provided to the read/write amplifiers 120. The read data is provided along the data bus and output to outside from the data terminals DQ via the input/output circuit 122.

The device 100 may receive an access command which is a write command. When the write command is received, and a bank address, a row address and a column address are timely supplied with the write command, write data supplied to the data terminals DQ is provided along the data bus and written to a memory cells in the memory array 118 corresponding to the row address and column address. The write command is received by the command decoder 106, which provides internal commands so that the write data is received by data receivers in the input/output circuit 122. Write clocks may also be provided to the external clock terminals for timing the receipt of the write data by the data receivers of the input/output circuit 122. The write data is supplied via the input/output circuit 122 to the read/write amplifiers 120, and by the read/write amplifiers 120 to the memory array 118 to be written into the memory cell MC.

The device 100 includes refresh control circuits 116, each associated with a sub-bank of the memory array 118. Each refresh control circuit 116 may determine when to perform a refresh operation on the associated sub-bank. The refresh control circuit 116 provides a refresh address RXADD (along with one or more refresh signals, not shown in FIG. 1). The row decoder 108 performs a refresh operation on one or more word lines associated with RXADD.

The refresh control circuit 116 may perform multiple types of refresh operation, which may determine how the address RXADD is generated, as well as other details such as how many word lines are associated with the address RXADD. For example, the refresh control circuit 116 may perform sequential refresh operations, where the refresh address RXADD is generated based on a sequence of refresh operations. For example, after a first sequential refresh operation with an address RXADD, the next sequential refresh operation may generate an address RXADD+1. Sequential refresh addresses may be associated with multiple word lines, for example by truncating the address RXADD compared to a full row address XADD, and refreshing all word lines which share the truncated portion in common. Over the course of a refresh cycle, the sequential refresh operations may refresh all word lines in the sub array (e.g., by sequentially generating addresses associated with all word lines) and then the sequence may recycle.

As well as sequential refresh operations, the refresh control circuit 116 may perform targeted refresh operations, where the refresh address RXADD is based on a detected aggressor word lines. Certain access patterns (e.g., row hammering) to a row may cause an increased rate of data decay in the memory cells of other nearby rows. It is useful to identify these aggressor rows so that their victims can be refreshed. The refresh control circuit may include logic which detects aggressors (e.g., when a number of accesses to a given row crosses a threshold) and then generates a refresh address RXADD based on the detected aggressor. For example, if the aggressor is AggXADD, then the refresh control circuit may refresh adjacent and/or nearby word lines such as one or more of AggXADD+1, AggXADD−1, AggXADD+2, AggXADD−2, etc. The targeted refresh operations may occur based on a number of sequential operations which have occurred. In some embodiments, targeted refresh operations may 'steal' a timeslot which would otherwise have been used for a sequential refresh operation. For example, every $N^{th}$ sequential refresh operation may be replaced with a targeted refresh operation instead.

The refresh control circuit 116 may perform refresh operations on the associated sub-bank with timing based, in part, on accesses to other sub-banks of the same bank. For example, if there are two sub-banks per bank, when a word line is accessed in the first sub-bank, the refresh control circuit 116 associated with the second sub-bank may refresh one or more word lines in the second sub-bank. The refresh control circuit 116 may also receive refresh management RFM commands which may cause the refresh control circuit 116 to perform a targeted refresh operation. The RFM command may be issued by a controller external to the device 100.

In some embodiments, the refresh control circuits may receive timing signals from a refresh period (tREFI) timer which may be used to manage a number of refreshes performed in each refresh period. For example, the refresh control circuit 116 may perform up to a certain number of refreshes in each refresh period, and then ignore subsequent opportunities to perform further refreshes (e.g., ignore further accesses to the other sub-bank). The refresh control circuit 116 may also determine if not enough refreshes were performed in a refresh period and if so, issue a refresh command which causes refreshes to be performed.

In some embodiments, one or more functions described with respect to the refresh control circuit 116 may be performed by refresh control circuits of a host or controller of the memory device 100 may monitor accesses to the different sub-banks, and count a number of refreshes performed in the other sub-bank based on the accesses (e.g., if an access is performed in a first sub-bank, the controller may increase a refresh counter for the second-sub-bank). If the controller determines that not enough refresh operations were performed during the refresh period, then additional refresh commands may be issued to that sub-bank. In some embodiments, the memory may notify the controller each time the refreshes start being ignored. If the controller is not notified, then at the end of the refresh period the controller may provide refresh commands to the specified sub-bank.

The power supply terminals are supplied with power supply potentials VDD and VSS. The power supply potentials VDD and VSS are supplied to an internal voltage generator circuit 124. The internal voltage generator circuit 124 generates various internal potentials VARY, and the like based on the power supply potentials VDD and VSS supplied to the power supply terminals.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
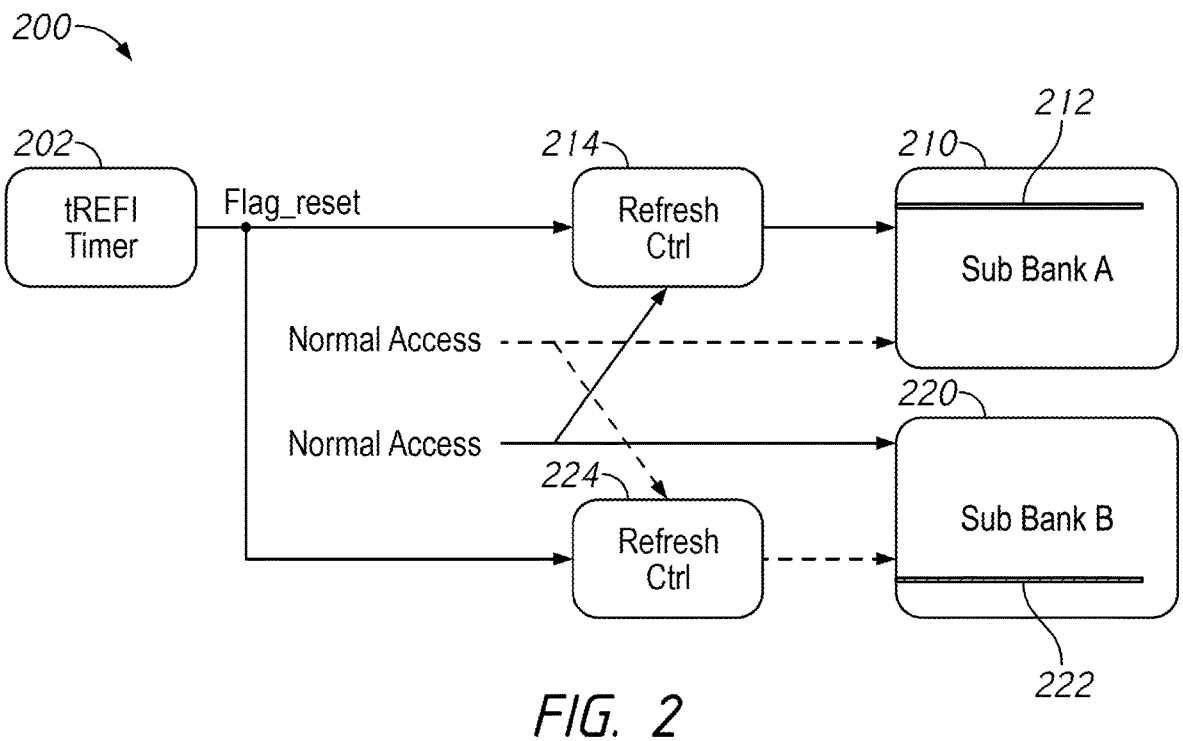
FIG. 2 is a block diagram of a sub-bank refresh logic according to some embodiments of the present disclosure.

FIG. 2 is a block diagram of a sub-bank refresh logic according to some embodiments of the present disclosure. The sub-bank refresh logic 200 may represent a portion of the device 100 in some embodiments. For the sake of clarity, FIG. 2 may omit certain components and signals.

The sub-bank refresh logic 200 shows a first sub-bank 210 and a second sub-bank 220, both of which may be sub-banks of a same bank in a memory array (e.g., 118 of FIG. 1). Each sub-bank includes a respective word line, a first word line 212 in the first sub-bank 210 and a second word line 222 in the second sub-bank 220. Each sub-bank is associated with a respective refresh control circuit (e.g., 116 of FIG. 1), a first refresh control circuit 214 associated with the first sub bank 210 and a second refresh control circuit 224 associated with the second sub-bank 220. The two refresh control circuits 214 and 224 are coupled in common to a refresh period timing circuit 202.

The refresh period timing circuit 202 provides a flag reset signal at the beginning of every tREFI period. For example, the refresh period timing circuit 202 may count activations (e.g., rising edges) of a periodic signal, which may be an oscillator signal or a system clock signal such as CK (and/or a signal derived from the system clock). When that count reaches a threshold, the timer circuit 202 may provide the flag reset signal and reset the count.

Each refresh control circuit 214 and 224 may refresh one or more word lines in their respective sub-banks based on an access to the other sub-bank. For example, when a word line such as 212 is accessed in sub-bank 210, the refresh control circuit 224 may refresh a word line (e.g., 222) in the second sub-bank 220 while the word line is accessed in the first sub-bank 210. Similarly, when a word line such as 222 is accessed in sub-bank 220, the refresh control circuit 214 may refresh a word line (e.g., 212) in the first sub-bank 210 while the word line is accessed in the second sub-bank 220. The two refresh control circuits may independently generate their respective refresh addresses. For example, the two different refresh control circuits may both perform sequential refresh operations, but at different places in their respective sequences of addresses.

In some embodiments, the flag reset signal may be used to help control a number of refresh operations in each refresh period. For example, responsive to the flag reset signal, each refresh control circuit 214 and 224 may set a refresh flag to an active level. Each refresh control circuit 214 and 224 may perform refreshes on its respective sub-bank while the refresh flag is set. When a threshold number of refreshes have been performed, the refresh control circuit may unset its refresh flag. If the flag reset signal is received while the refresh flag is still set (indicating not enough refreshes were performed), then the refresh control circuit may issue a refresh signal REF. Responsive to the refresh signal, the sub-bank may be refreshed, but access operations to both sub-banks may be interrupted.

Figure 3:
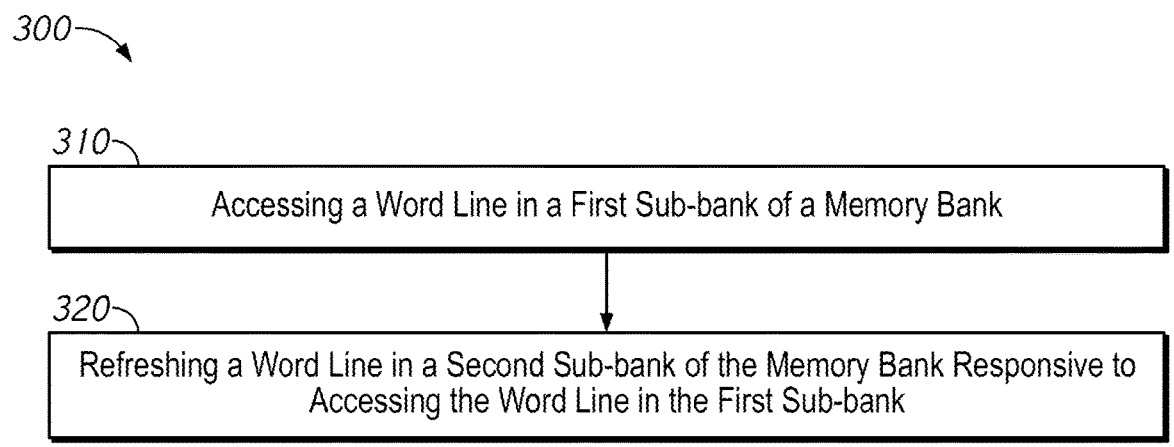
FIG. 3 is a block diagram of a method according to some embodiments of the present disclosure.

FIG. 3 is a block diagram of a method according to some embodiments of the present disclosure. The method 300, may, in some embodiments, be implemented by one or more of the apparatuses or systems as described herein, such as the device 100 of FIG. 1 and/or the sub-bank refresh logic 200 of FIG. 2.

The method 300 includes box 310 which describes accessing a word line in a first sub-bank of a memory bank. For example, the memory may receive an access command along with row, column, and bank addresses at C/A terminals (e.g., from a controller). The bank address may be associated with the memory bank, and the row address may be associated with the word line in the first sub-bank.

The method 300 includes box 320, which describes refreshing a word line in a second sub-bank of the memory bank responsive to accessing the word line in the first sub-bank. For example a refresh control circuit associated with the second sub-bank (e.g., refresh control circuit 224 of FIG. 2) may receive the address, determine if the address is associated with the second sub-bank or not, and if it is not, provide a refresh address. The method may include refreshing the word line in the second sub-bank while accessing the word line in the first sub-bank.

In some embodiments, the method 300 may include determining if a threshold number of refresh operations have been performed on the second-sub bank in a current refresh period and skipping refreshing the second-sub bank if so. In some embodiments, the method 300 may include determining if less than a threshold number of refresh operations have been performed over the previous refresh period and issuing a refresh command if so. The method 300 may include performing at least one refresh operation responsive to the refresh command.

Figure 4:
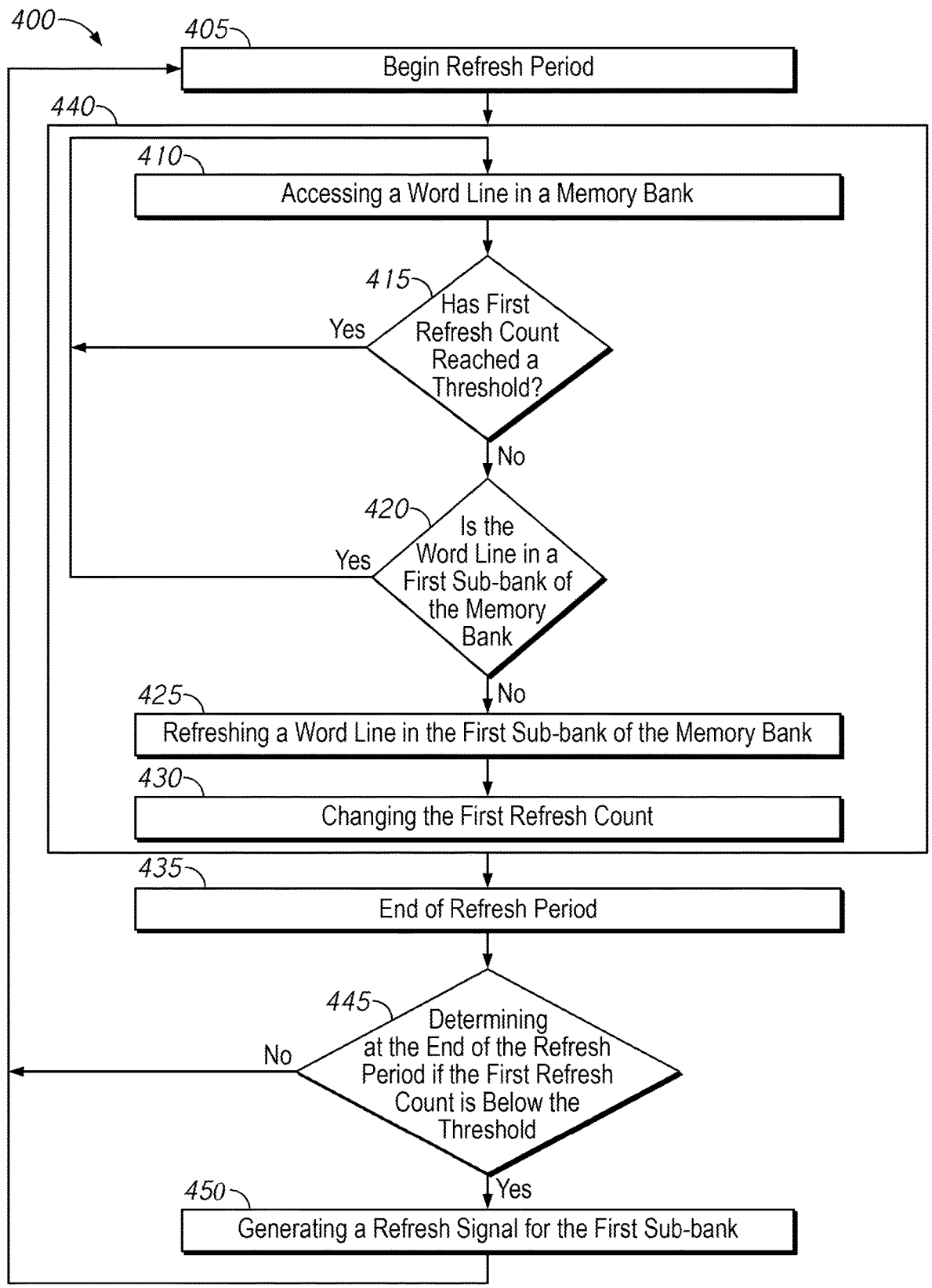
FIG. 4 is a flow chart of a method according to some embodiments of the present disclosure.

FIG. 4 is a flow chart of a method according to some embodiments of the present disclosure. The method 400 of FIG. 4 may, in some embodiments, be an implementation of the method 300 of FIG. 3 which includes tracking a number of refreshes. The method 400 may, in some embodiments, be implemented by one or more of the apparatuses or systems as described herein, such as the device 100 of FIG. 1 and/or the sub-bank refresh logic 200 of FIG. 2. For example, the method 400 may represent a method performed by a first refresh control circuit (e.g., 214 of FIG. 2) associated with a first sub-bank (e.g., 210) of a memory bank. In some embodiments, one or more of the steps of the method 400 may be performed by a controller of the memory.

The method 400 generally begins with block 405 which describes beginning a refresh period. The refresh period may be a period of time tREFI which is a setting of the memory. The memory may include a tREFI timer (e.g., 202 of FIG. 2) which provides a signal (e.g., Flag_reset) to indicate when a refresh period begins. The method 400 may include resetting a refresh count responsive to the refresh period beginning (e.g., responsive to the signal Flag_set). In some embodiments, the refresh period may begin in common for the refresh control circuits of multiple sub-banks. For example, the signal Flag_reset may be provided in common to multiple refresh control circuits, each associated with a different sub-bank.

The method 400 includes box 440 (which includes boxes 410-430), which describe things which happen during a refresh period. The refresh period may end a next time a signal is received from the tREFI timer (e.g., after a period of time tREFI has passed).

The method 400 includes block 410, which describes accessing a word line. For example, an access command such as a read or write may be provided with an associated row address. The method 400 includes block 415, which describes determining if a first refresh count has reached a threshold. The first refresh count may be a refresh count stored in the first refresh control circuit. The first refresh count may be associated with the first sub-bank, and may be independent of refresh counts associated with other sub-banks. If the first refresh count has reached the threshold, then the method may return to an idle state until a next access command (e.g., box 410) is received. Since the count is not reset during the refresh period (e.g., during box 440), the method 400 may include skipping further refresh actions for the first sub-bank (e.g., the steps of boxes 420-430) for a remainder of the current refresh period. The method 400 includes box 420 which describes determining if the word line (accessed in box 410) is in a first sub-bank of the memory bank. If it is, then the method 400 may return to an idle state of box 440 until a next access command is received. If the word line is not in the first sub-bank, then the method 400 may proceed to box 425. For example, the method 400 may determine that the accessed word line is in a different sub-bank of the memory bank.

Box 425 describes refreshing a word line in the first sub-bank of the memory bank. The method 400 may include generating a refresh address and refreshing one or more word lines associated with the refresh address. The refresh address may be a sequential refresh address or a targeted refresh address. The method 400 includes box 430 which describes changing the first refresh count. For example the method 400 may include incrementing the first refresh count responsive to refreshing the word line in the first sub-bank.

The steps of box 440 may generally repeat (e.g., repeat each time an access on the memory bank is performed), until the period of time tREFI passes, which may mark the end of the a refresh period. The method 400 includes box 435 which describes ending the refresh period. For example, the refresh period may end when the tREFI timer indicates a period of time tREFI has passed. Similar to the beginning of the refresh period described in box 405, the refresh period may end in common for more than one refresh control circuit.

The method 400 includes box 445 which describes determining at the end of the refresh period if the first refresh count is below the threshold. If the first refresh count is not below the threshold, then the method 400 may return to block 405 at the beginning of a next refresh period. If the count is below the threshold, then the method 400 may proceed to box 450, which describes generating a refresh signal for the first sub-bank. The method 400 may include refreshing a word line in the first sub-bank responsive to the refresh signal. The method 400 may return to box 405 at the beginning of a next refresh period.

The method 400 may represent a method performed by a refresh control circuit associated with a single sub-bank of a memory. For example, the steps of the box 440 and 445-450 may each be performed separately by a refresh control circuit associated with each sub-bank. For example, each refresh control circuit may include a separate refresh count (e.g., a first refresh count associated with a first sub-bank, a second refresh count associated with a second sub-bank, etc.) and may use that refresh count to determine if a refresh signal should be generated for that sub-bank.

For example, the method may include beginning a refresh period in common for both a first and a second refresh control circuit. The method 400 may include accessing a word line in a memory bank (e.g., box 410) and determining with the first refresh control circuit if the first refresh count has a reached a threshold (e.g., box 415) and determining with a second refresh control circuit is a second refresh count has reached a threshold. If not, then the method may include determining if the word line is in a first sub-bank with the first refresh control circuit (e.g., box 420) and determining if the word line is in a second sub-bank with the second refresh control circuit. If the word line is not in the first sub-bank, then the method may include refreshing a word line in the first sub-bank and changing (e.g., incrementing) the first refresh count (e.g., boxes 425-430). If the word line is not in the second sub-bank, then the method 400 may include refreshing a word line in the second sub-bank and changing (e.g., incrementing) the second refresh count. The method 400 may include determining at the end of the refresh period (which may end in common for both refresh control circuits) if the first refresh count is below the threshold and if the second refresh count is below the threshold. If the first refresh count is below the threshold the method may include generating a refresh signal for the first sub-bank and refreshing a word line in the first sub-bank responsive to the refresh signal. If the second refresh count is below the threshold the method may include generating a refresh signal for the second sub-bank and refreshing a word line in the second sub-bank responsive to the refresh signal. If both the first and the second refresh counts are below the threshold, then a refresh signal may be generated for both sub-banks. If only one of the sub-bank's refresh counts is below the threshold, but the other is at or above the threshold, then only the sub-bank with the refresh count below the threshold is refreshed.

In some embodiments, a controller may perform steps 445 and 450 of the method 400. For example, the controller may include the refresh counts and may change the refresh counts responsive to issuing access commands. For example, when the controller issues an access command which is not in the first sub-bank, a first refresh count in the controller may be changed (e.g., incremented). At the end of a refresh period, if the refresh count is below a threshold, the controller may issue a refresh command to the first sub-bank.

In some embodiments, the memory may manage the counts, but the controller may manage providing the extra refresh signals of block 450. For example, the method 400 may include notifying the controller if the first refresh count has reached the threshold (e.g., as part of block 415). If the controller has not been notified at the end of the refresh period, the controller may issue a refresh command to the memory directed to the first sub-bank.

Figure 5:
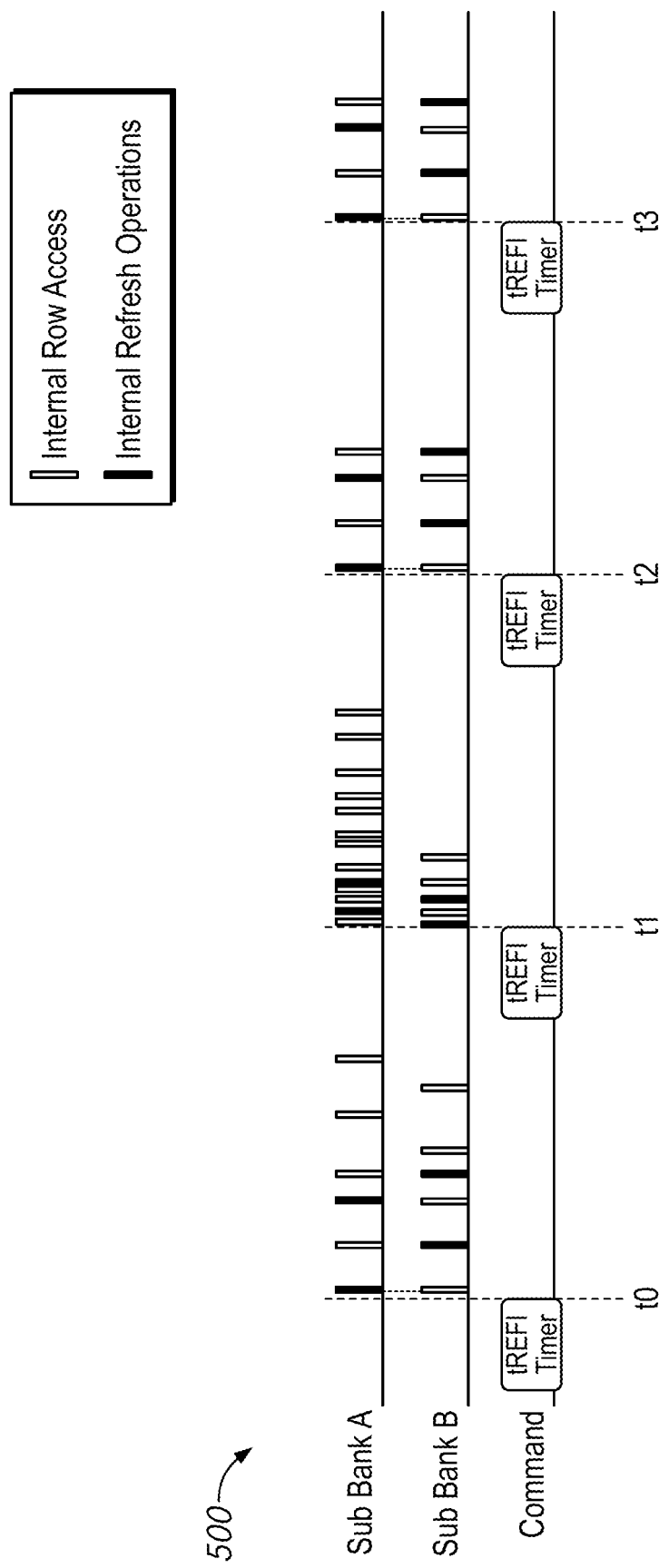
FIG. 5 is a timing diagram of refresh operations according to some embodiments of the present disclosure.
Figure 6:
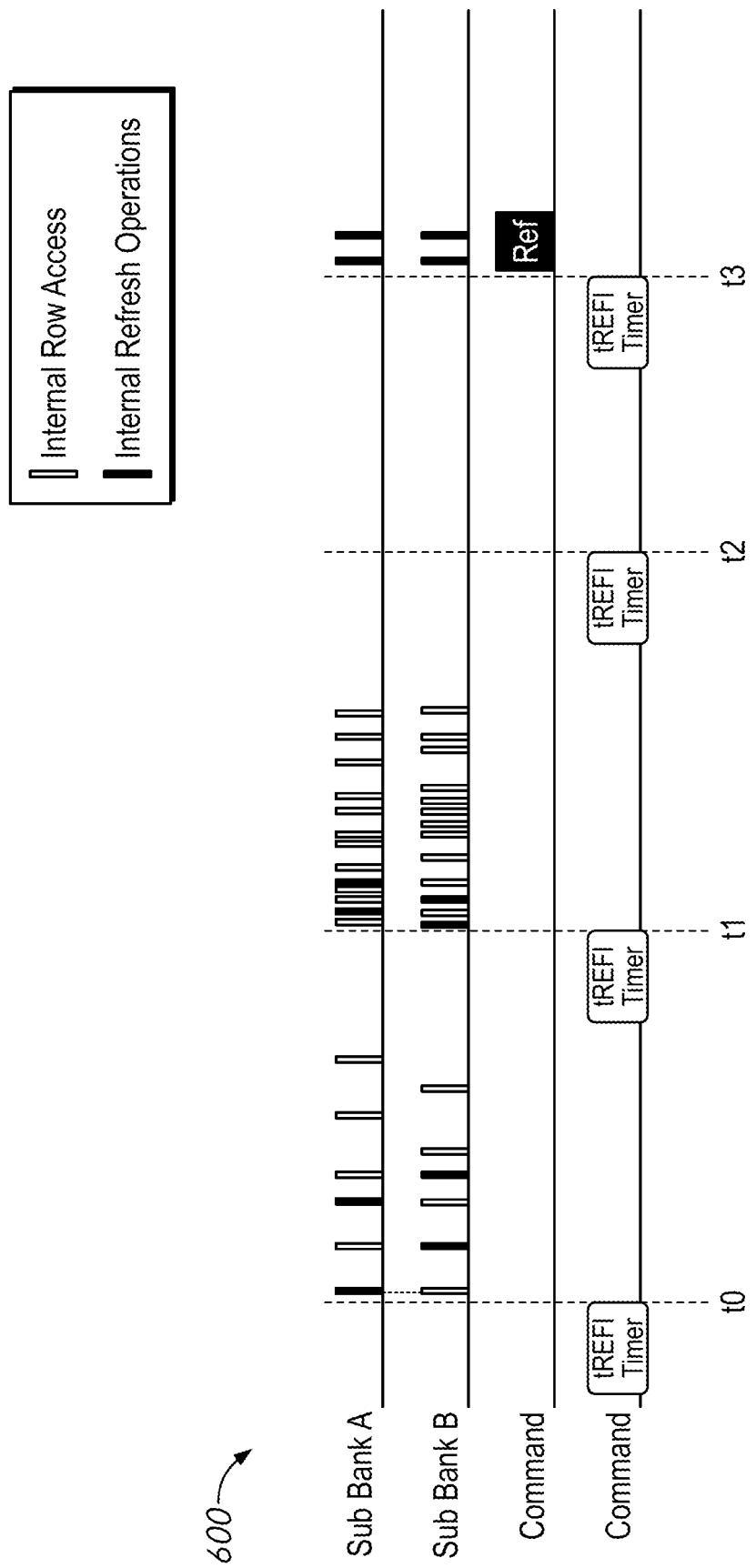
FIG. 6 is a timing diagram of refresh operations according to some embodiments of the present disclosure.
Figure 7:
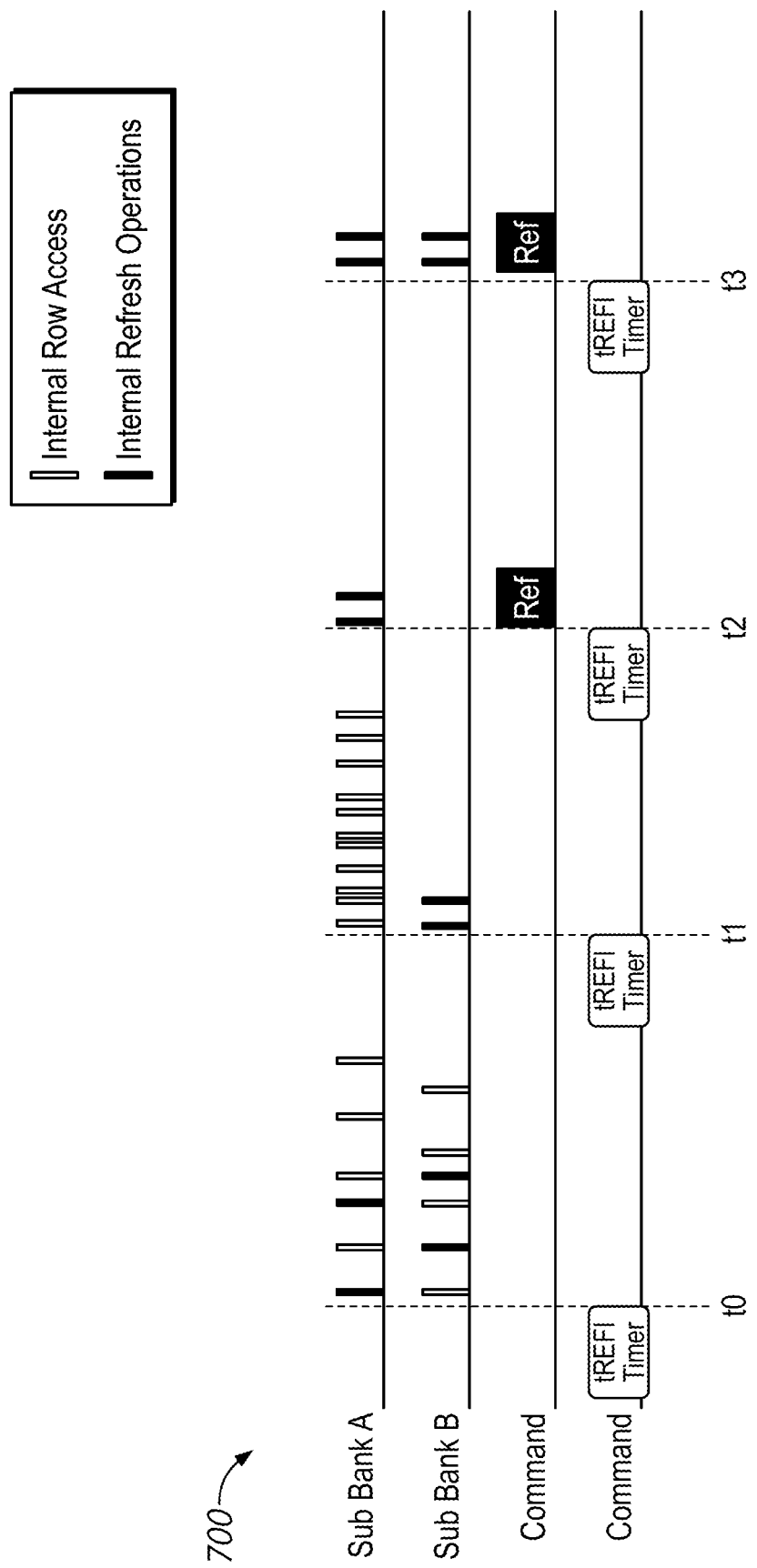
FIG. 7 is a timing diagram of refresh operations according to some embodiments of the present disclosure.

FIGS. 5-7 show timing diagrams which represent example operations of a memory according to some embodiments of the disclosure. The different timing diagram of FIGS. 5-7 represent different example scenarios which are illustrative of different circumstances of the operation. In some embodiments, each of the timing diagrams may represent the operations of a single memory device (e.g., at different times and/or under different circumstances).

The timing diagrams of FIGS. 5-7 generally show refresh and access operations in a first and second sub-bank of a memory bank, here labelled sub-bank A and sub-bank B. The timing diagrams also show commands which may be received by the sub-bank such as a tREFI timer signal which represents when a refresh period has begun (and when a previous refresh period has ended) and refresh commands, which may be generated by a refresh control circuit associated with the sub-bank.

The timing diagrams of FIGS. 5-7 may represent an implementation of the method 400 of FIG. 4, and may be implemented by any of the apparatuses of FIGS. 1-2. As an example, each of the FIGS. 5-7 represent an example embodiment where each sub-bank expects two refresh operations to be performed each refresh period (e.g., the threshold of FIG. 4 is two). However, more or fewer refresh operations per refresh period may be expected in other example embodiments.

FIG. 5 is a timing diagram of refresh operations according to some embodiments of the present disclosure. The timing diagram 500 represents an operation of the sub-banks where enough access operations are being performed that sufficient refresh operations are performed on each sub-bank during each refresh period (e.g., the refresh count is meeting the threshold).

At an initial time t0, a first refresh period begins, and the refresh counters associated with sub-banks A and B are both reset (e.g., reset to zero). Just after t0, an access command is received for sub-bank B. Since the access is to sub-bank B, and since the refresh counter for sub-bank A is below the threshold (e.g., zero is less than two), a refresh operation is performed in sub-bank A. Similarly, a subsequent access to sub-bank A causes a refresh to be performed in sub-bank B, and the next access to each sub-bank causes a refresh in the other sub-bank. However, once two refreshes have been performed in each sub-bank (e.g., since the threshold is two), even when there are further accesses in the other sub-bank, further refreshes are not performed.

At the beginning of the next refresh period at t1, the counters are both reset and this pattern repeats. Since during the refresh periods beginning at t1, t2, and t3, the threshold number of refreshes is met (e.g., there are two refreshes due to at least two accesses in the other sub-bank), no refresh signals REF are provided.

FIG. 6 is a timing diagram of refresh operations according to some embodiments of the present disclosure. The timing diagram 600 represents a situation where a refresh interval passes without any accesses being performed on either sub-bank (e.g., not enough refresh operations are performed in a refresh interval) which leads to a refresh signal REF being generated.

Similar to FIG. 5, the refresh periods t0 and t1 may both pass with enough refreshes performed on both sub-banks. During a refresh period beginning at t2, no access commands are received at either sub-bank. Accordingly, when the refresh period ends at t3, both sub-banks have refresh counters which are below the threshold. Responsive to a new refresh period beginning at t3, the refresh control circuits for both sub-banks may provide a refresh signal REF, and responsive to that refresh signal, two refresh operations are performed in both of the sub-banks. The refresh operations performed responsive to REF may prevent access operations in bank (e.g., in either sub-bank from occurring).

FIG. 7 is a timing diagram of refresh operations according to some embodiments of the present disclosure. The timing diagram 700 represents a situation where a threshold number of refreshes are performed in one sub-bank, but not in the other, during a refresh period.

The refresh period beginning at t0 is similar to the FIGS. 5-6 where a threshold number of refresh operations are performed (e.g., because at least a threshold number of accesses are performed in the other sub-bank). During a refresh period beginning at t1, only sub-bank A is accessed. Accordingly, two refreshes are performed in sub-bank B (since at least two accesses were performed in sub-bank A). However, refreshes are not performed in sub-bank A (because there are no accesses to sub-bank B). At the end of the refresh period (e.g., at t2, the beginning of the next refresh period), the refresh control circuit associated with sub-bank A may issue a refresh signal REF (since the refresh counter for sub-bank A is below the threshold at the end of the refresh period). Accordingly, refresh operations may be performed in sub-bank A responsive to the refresh signal REF. Additional refresh operations are not performed in sub-bank B responsive to the refresh signal REF issued at t2. Similar to FIG. 6, no accesses are performed during the refresh period beginning at t2, and so at the beginning of the next refresh period, a refresh signal REF is issued for both sub-banks.

Figure 8:
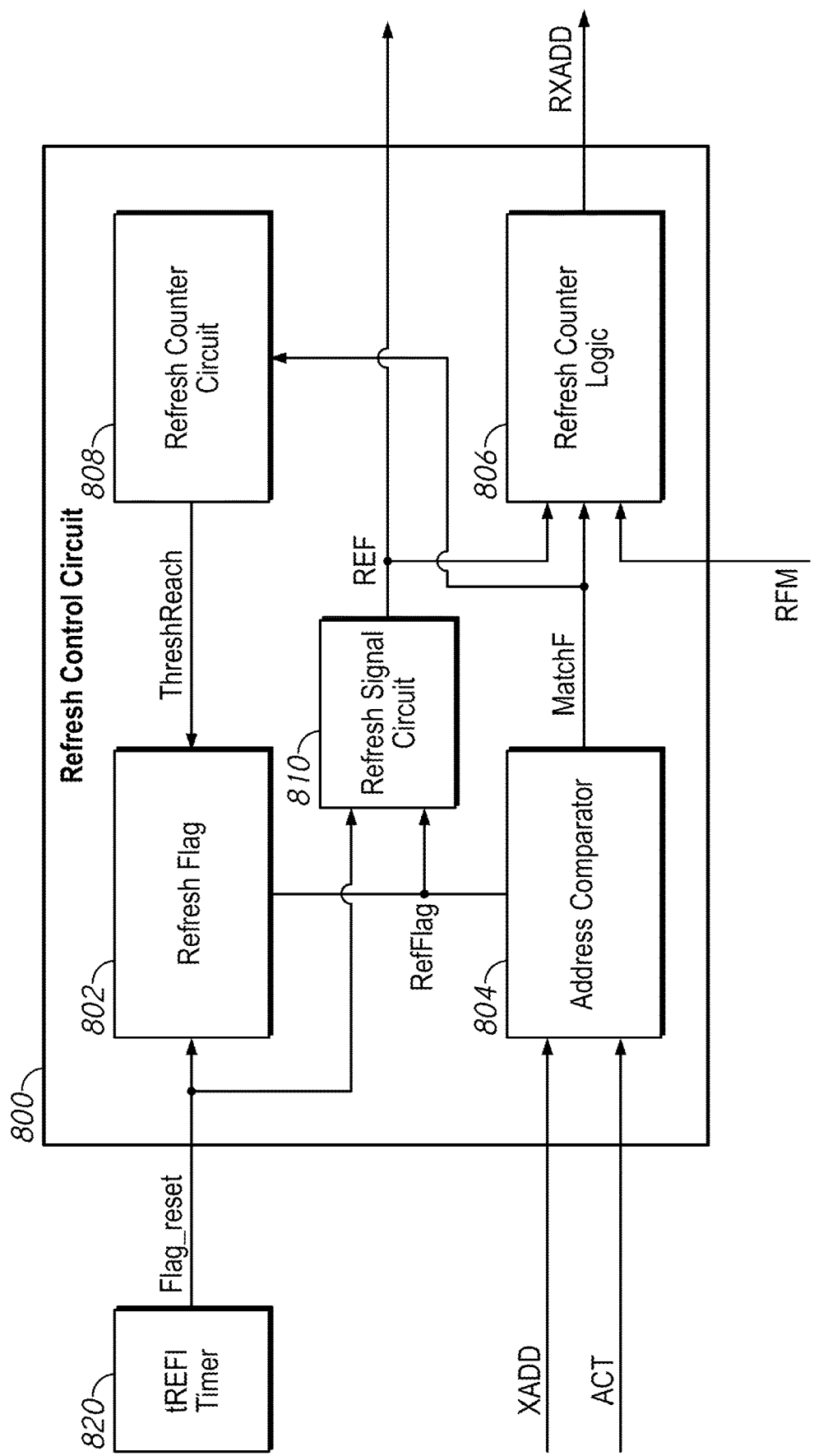
FIG. 8 is a block diagram of a refresh control circuit according to some embodiments of the present disclosure.

FIG. 8 is a block diagram of a refresh control circuit according to some embodiments of the present disclosure. The refresh control circuit 800 may, in some embodiments, implement the refresh control circuit 116 of FIGS. 1 and/or 214/224 of FIG. 2. The refresh control circuit 800 may be associated with one sub-bank of a memory array. Each sub-bank may have a refresh control circuit similar to the refresh control circuit 800.

The refresh control circuit 800 includes a refresh flag 802 which determines if refreshes should be performed, an address comparator 804 which determines if an accessed row address XADD is associated with the same sub-bank as the refresh control circuit 800, refresh address logic 806 which generates refresh addresses RXADD when a refresh is called for, a refresh counter circuit 808 which counts a number of refresh operations during a refresh interval, and a refresh signal circuit 810 which provides a refresh signal REF. Also shown in FIG. 8 is a refresh period timer circuit 820 (e.g., 202 of FIG. 2) which measures a refresh interval.

The refresh period timer circuit 820 provides a flag reset signal Flag_reset at the beginning of a refresh period. The refresh period may be a period of time tREFI. The refresh period timer circuit 820 counts an amount of time and provides the signal Flag_reset each time the period tREFI passes.

The refresh control circuit 800 includes a refresh flag circuit 802 which sets a refresh flag RefFlag to an active level responsive to the signal Flag_reset. The refresh flag circuit 802 may be unset to an inactive level responsive to a signal ThreshReach from the refresh counter circuit.

The address comparator 804 may receive a row address XADD which is being accessed in the current bank. The address comparator 804 may determine if the address XADD is associated with the same sub-bank as the refresh control circuit 800 when the refresh flag RefFlag is set at an active level. If the address XADD is not part of the sub-bank, then the address comparator may provide an activation of a complementary match signal MatchF (e.g., at a high logical level). If the address XADD is in the same sub-bank then MatchF may be provided at an inactive level (e.g., a low logical level). If the refresh flag RefFlag is unset (at an inactive level) then the address comparator 804 may ignore the address XADD and the signal MatchF may remain at an inactive level.

Responsive to the activation of the signal MatchF, the refresh address logic 806 provides a refresh address RXADD. The refresh address logic 806 may use internal logic to determine what type of refresh address to provide (e.g., a sequential refresh address or a targeted refresh address). Although not shown in FIG. 8, the refresh address logic 806 may receive the row address XADD and use received addresses to generate targeted refresh addresses. The refresh address logic 806 may also provide one or more refresh addresses RXADD responsive to a refresh signal REF provided by the refresh signal circuit 810. The refresh address logic may provide more refresh addresses responsive to REF than responsive to MatchF. For example, one RXADD may be provided responsive to MatchF and two RXADDs may be supplied responsive to REF. The refresh address logic 806 may also provide an RXADD for a targeted refresh operations responsive to a refresh management signal RFM, which may be provided by a controller of the memory.

A refresh counter circuit 808 may include a refresh count which changes responsive to activations of MatchF. For example, responsive to an activation of MatchF, the refresh counter circuit 808 may increment the refresh count. Each time the refresh counter circuit is updated the refresh counter circuit 808 may compare the refresh count to a threshold. When the refresh count meets (or exceeds) the threshold the refresh counter circuit 808 may provide an activation of a threshold reached signal ThreshReach. The threshold may be set based on a number of refresh operations which are expected in each refresh period. The refresh counter circuit 808 may reset the refresh count to an initial value (e.g., 0) responsive to the Flag_reset signal (indicating a beginning of a new refresh period).

Responsive to the signal ThreshReach, the refresh flag circuit 802 may unset the refresh flag RefFlag. Once the refresh flag is unset, the address comparator 804 may no longer compare the received address XADD to determine if the address XADD is in the associated sub-bank. Accordingly, once the refresh count has been reached in a refresh period and ThreshReach has been activated, the RefFlag may be unset and no more refreshes may be performed due to activations (although refreshes due to REF or RFM signals may still be performed).

When the signal Flag_reset is received, indicating an end of a current refresh period and a beginning of the next one, a refresh signal circuit 810 may check a state of RefFlag. If RefFlag is still set (indicating that the refresh count did not reach the threshold), the refresh signal circuit 810 may issue the refresh signal REF. Refreshes performed due to the refresh signal may interrupt access operations in other sub-banks of the bank.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. A method comprising:
   accessing a word line in a first sub-bank of a memory bank;
   refreshing a word line in a second sub-bank of the memory bank responsive to accessing the word line in the first sub-bank;
   counting a number of times a refresh operation is performed on the second sub-bank; and
   providing a refresh signal based on the number of times being less than a threshold at an end of a refresh period.

2. The method of claim 1, further comprising skipping refreshing the second sub-bank for a remainder of a refresh period if the number of times meets or exceeds a threshold.

3. The method of claim 1, further comprising:
accessing a word line in the second sub-bank; and
refreshing a word line in the first sub-bank responsive to accessing the word line in the second sub-bank.

4. The method of claim 1, further comprising:
setting a refresh flag at a beginning of a refresh period; and
refreshing the word line in the second sub-bank when the refresh flag is set.

5. The method of claim 4, further comprising unsetting the refresh flag when a threshold number of refresh operations have been performed in the second sub-bank.

6. An apparatus comprising:
a memory bank comprising a first sub-bank and a second-sub bank;
a refresh control circuit configured to refresh at least one word line in the first sub-bank when a word line in the second sub-bank is accessed; and
a refresh period timer circuit configured to provide a flag reset signal at the beginning of each refresh period, wherein:
the refresh control circuit includes a refresh flag which is reset to a set state responsive to the flag reset signal; and
the refresh control circuit is configured to refresh the at least one word line in the first sub-bank when a word line in the second sub-bank is accessed and when the refresh flag is in the set state.

7. The apparatus of claim 6, further comprising:
a second refresh control circuit configured to refresh at least one word line in the second sub-bank when a word line in the first sub-bank is accessed.

8. The apparatus of claim 6, wherein the refresh control circuit comprises a refresh counter circuit configured to count a number of times the refresh control circuit refreshes the at least one word line in the first sub-bank when a word line in the second sub-bank is accessed, and wherein when the count reaches a threshold the refresh flag is changed to an unset state.

9. The apparatus of claim 6, wherein the refresh control circuit is configured to provide a refresh signal if the flag reset signal is received and the refresh flag is in the set state.

10. The apparatus of claim 6, wherein the refresh control circuit comprises:
an address comparator configured to provide a complimentary match signal at an active level when a row address associated with the word line does not match an address in the second sub-bank; and
a refresh address logic circuit configured to provide a refresh address responsive to the match signal at the active level.

11. The apparatus of claim 10, wherein the refresh address logic circuit is further configured to provide the refresh address responsive to a refresh signal or a refresh management signal.

12. A method comprising:
accessing a word line in a memory bank;
determining if a refresh count has reached a threshold;
determining if the word line is in a first sub-bank of the memory bank if the refresh count has not reached the threshold; and
refreshing a word line in the first sub-bank if the accessed word line is determined to not be in the first sub-bank.

13. The method of claim 12, further comprising changing the refresh count responsive to refreshing the word line.

14. The method of claim 12, further comprising generating a refresh signal if the refresh count is below the threshold at the end of a refresh period.

15. The method of claim 14, further comprising refreshing a word line of the first sub-bank responsive to the refresh signal.

16. The method of claim 12, further comprising refreshing a word line of the first sub-bank responsive to a refresh management signal received from a controller.

17. The method of claim 1, further comprising:
receiving a row address associated with the word line; and
determining if the word line is in a first sub-bank based on the row address associated with the word line.

18. An apparatus comprising:
a first sub-bank of a memory bank;
a second sub-bank of the memory bank;
a first refresh control circuit associated with the first sub-bank, the first refresh control circuit configured to generate a first refresh address responsive to a refresh operation on the first sub-bank; and
a second refresh control circuit associated with the second sub-bank, the second refresh control circuit configured to generate a second refresh address responsive to a refresh operation on the second sub-bank.

19. The apparatus of claim 18, wherein the first refresh control circuit is configured to provide the first refresh address responsive to an access in the second sub-bank, and wherein the second refresh control circuit is configured to provide the second refresh address responsive to an access in the first sub-bank.

20. The apparatus of claim 18, wherein the first refresh control circuit is configured to generate the first refresh address independently of the second refresh control circuit generating second refresh address.

* * * * *